US011183488B2

(12) United States Patent
Liu et al.

(10) Patent No.: US 11,183,488 B2
(45) Date of Patent: Nov. 23, 2021

(54) THREE-DIMENSIONAL MEMORY DEVICES WITH STACKED DEVICE CHIPS USING INTERPOSERS

(71) Applicant: YANGTZE MEMORY TECHNOLOGIES CO., LTD., Wuhan (CN)

(72) Inventors: Jun Liu, Wuhan (CN); Li Hong Xiao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/996,356

(22) Filed: Aug. 18, 2020

(65) Prior Publication Data

US 2020/0381408 A1 Dec. 3, 2020

Related U.S. Application Data

(60) Division of application No. 16/139,053, filed on Sep. 23, 2018, now Pat. No. 10,797,028, which is a
(Continued)

(51) Int. Cl.
*H01L 25/10* (2006.01)
*H01L 21/48* (2006.01)
(Continued)

(52) U.S. Cl.
CPC .......... *H01L 25/105* (2013.01); *H01L 21/486* (2013.01); *H01L 21/4857* (2013.01);
(Continued)

(58) Field of Classification Search
None
See application file for complete search history.

(56) References Cited

U.S. PATENT DOCUMENTS

| 10,354,980 B1 | 7/2019 | Mushiga et al. |
| 2003/0003632 A1 | 1/2003 | Cleeves et al. |

(Continued)

FOREIGN PATENT DOCUMENTS

| CN | 1638121 A | 7/2005 |
| CN | 108028223 A | 5/2018 |
| JP | 2010050357 A | 3/2010 |

OTHER PUBLICATIONS

International Search Report issued in corresponding International Application No. PCT/CN2018/093738, dated Mar. 28, 2019, 4 pages.
(Continued)

*Primary Examiner* — Alexander G Ghyka
(74) *Attorney, Agent, or Firm* — Bayes PLLC

(57) ABSTRACT

Embodiments of three-dimensional (3D) memory devices with stacked device chips using interposers and fabrication methods thereof are disclosed. In an example, a method for forming a 3D memory device is disclosed. An alternating conductor/dielectric stack is formed at a first side of a chip substrate. A memory string extending vertically through the alternating conductor/dielectric stack is formed. A chip contact is formed at a second side opposite to the first side of the chip substrate and is electrically connected to the memory string. A first interposer contact is formed at a first side of an interposer substrate. A second interposer contact is formed at a second side opposite to the first side of the interposer substrate and is electrically connected to the first interposer contact through the interposer substrate. The first interposer contact is attached to the chip contact.

20 Claims, 14 Drawing Sheets

Related U.S. Application Data continuation of application No. PCT/CN2018/093738, filed on Jun. 29, 2018.

(51) Int. Cl.
 *H01L 23/48* (2006.01)
 *H01L 23/498* (2006.01)
 *H01L 23/00* (2006.01)
 *H01L 25/00* (2006.01)
 *H01L 27/11573* (2017.01)
 *H01L 27/11582* (2017.01)

(52) U.S. Cl.
 CPC ...... *H01L 23/481* (2013.01); *H01L 23/49816* (2013.01); *H01L 23/49822* (2013.01); *H01L 23/49827* (2013.01); *H01L 24/16* (2013.01); *H01L 25/50* (2013.01); *H01L 27/11573* (2013.01); *H01L 27/11582* (2013.01); *H01L 2224/16227* (2013.01); *H01L 2225/107* (2013.01); *H01L 2225/1058* (2013.01)

(56) References Cited

U.S. PATENT DOCUMENTS

| | | |
|---|---|---|
| 2010/0148338 A1 | 6/2010 | Shim et al. |
| 2010/0283053 A1 | 11/2010 | Clark et al. |
| 2012/0162928 A1 | 6/2012 | Das et al. |
| 2013/0015570 A1* | 1/2013 | Sato .................... H01L 23/3135 257/737 |
| 2013/0075895 A1 | 3/2013 | Miura et al. |
| 2015/0287465 A1* | 10/2015 | Park ....................... G11C 16/08 365/185.18 |
| 2016/0329343 A1 | 11/2016 | Pachamuthu et al. |
| 2017/0098599 A1 | 4/2017 | Zhou et al. |
| 2018/0005974 A1* | 1/2018 | Chiu ..................... H01L 25/105 |
| 2019/0043808 A1* | 2/2019 | Fontanelli ............... H01L 24/16 |

OTHER PUBLICATIONS

Written Opinion of the International Searching Authority issued in corresponding International Application No. PCT/CN2018/093738, dated Mar. 28, 2019, 5 pages.

* cited by examiner

THREE-DIMENSIONAL MEMORY DEVICES WITH STACKED DEVICE CHIPS USING INTERPOSERS

CROSS REFERENCE TO RELATED APPLICATION

This application is division of U.S. application Ser. No. 16/139,053, filed on Sep. 23, 2018, entitled "THREE-DIMENSIONAL MEMORY DEVICES WITH STACKED DEVICE CHIPS USING INTERPOSERS," which is continuation of International Application No. PCT/CN2018/093738, filed on Jun. 29, 2018, entitled "THREE-DIMENSIONAL MEMORY DEVICES WITH STACKED DEVICE CHIPS USING INTERPOSERS," both of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices with stacked device chips using interposers and fabrication methods thereof are disclosed herein.

In one example, a 3D memory device includes a first device chip, a second device chip, and an interposer disposed vertically between the first device chip and the second device chip. The first device chip includes a peripheral device and a first chip contact disposed on a surface of the first device chip and electrically connected to the peripheral device. The second device chip includes an alternating conductor/dielectric stack, a memory string extending vertically through the alternating conductor/dielectric stack, and a second chip contact disposed on a surface of the second device chip and electrically connected to the memory string. The interposer includes an interposer substrate, a first interposer contact disposed on a first surface of the interposer, and a second interposer contact disposed on a second surface opposite to the first surface of the interposer and electrically connected to the first interposer contact through the interposer substrate. The first interposer contact is attached to the first chip contact, and the second interposer contact is attached to the second chip contact.

In another example, a 3D memory device includes a first device chip, a second device chip, and an interposer disposed vertically between the first device chip and the second device chip. The first device chip includes a first alternating conductor/dielectric stack, a first memory string extending vertically through the first alternating conductor/dielectric stack, and a first chip contact disposed on a surface of the first device chip and electrically connected to the first memory string. The second device chip includes a second alternating conductor/dielectric stack, a second memory string extending vertically through the second alternating conductor/dielectric stack, and a second chip contact disposed on a surface of the second device chip and electrically connected to the second memory string. The interposer includes an interposer substrate, a first interposer contact disposed on a first surface of the interposer, and a second interposer contact disposed on a second surface opposite to the first surface of the interposer and electrically connected to the first interposer contact through the interposer substrate. the first interposer contact is attached to the first chip contact, and the second interposer contact is attached to the second chip contact.

In a different example, a method for forming a 3D memory device is disclosed. An alternating conductor/dielectric stack is formed at a first side of a chip substrate. A memory string extending vertically through the alternating conductor/dielectric stack is formed. A chip contact is formed at a second side opposite to the first side of the chip substrate and is electrically connected to the memory string. A first interposer contact is formed at a first side of an interposer substrate. A second interposer contact is formed at a second side opposite to the first side of the interposer substrate and is electrically connected to the first interposer contact through the interposer substrate. The first interposer contact is attached to the chip contact.

In another example, a method for forming a 3D memory device is disclosed. An alternating conductor/dielectric stack is formed at a first side of a chip substrate. A memory string extending vertically through the alternating conductor/dielectric stack is formed. A chip contact is formed at the first side of the chip substrate and is electrically connected to the memory string. A first interposer contact is formed at a first side of an interposer substrate. A second interposer contact is formed at a second side opposite to the first side of the interposer substrate and is electrically connected to the first interposer contact through the interposer substrate. The first interposer contact is attached to the chip contact.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
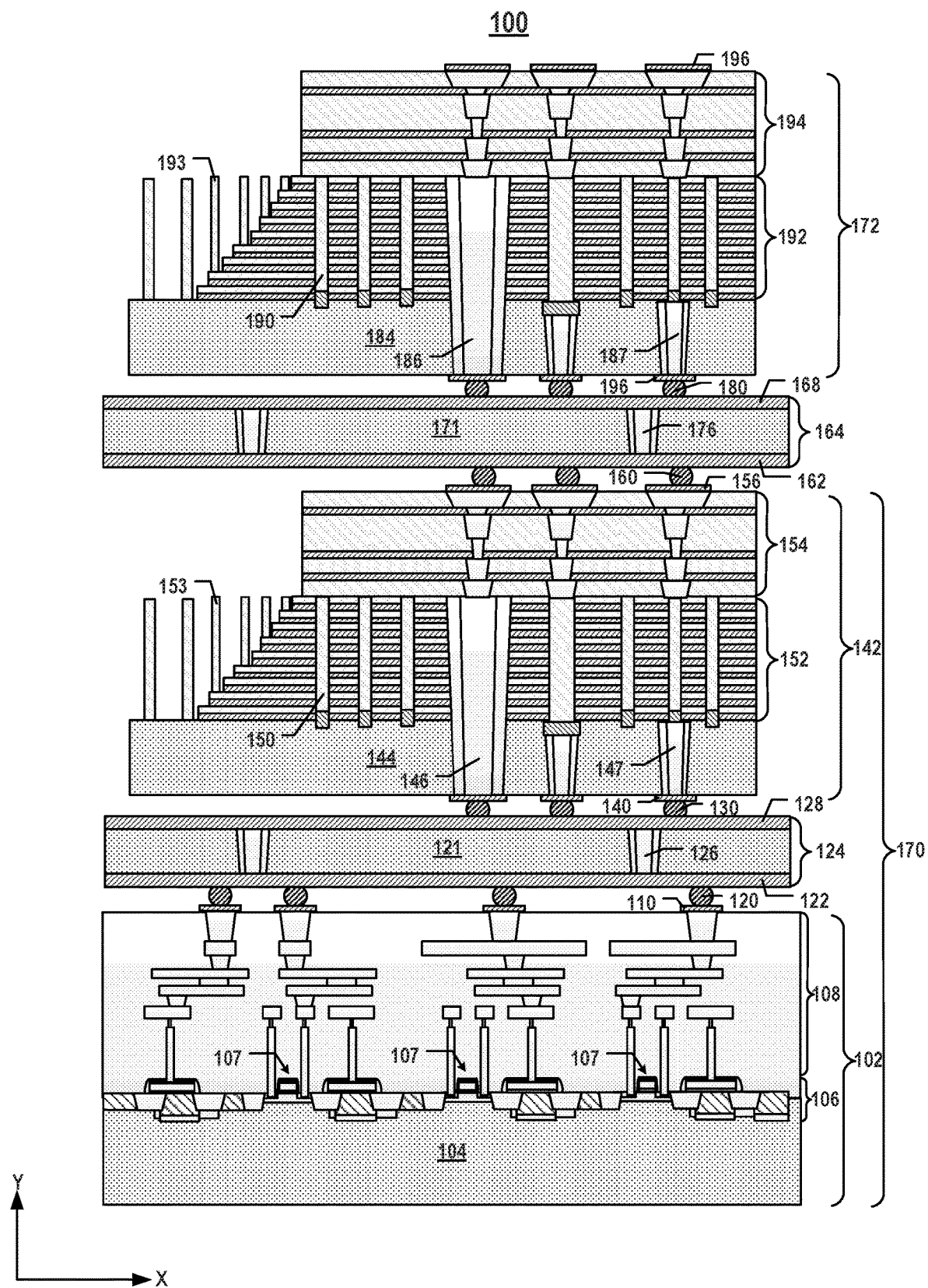
FIG. 1 illustrates a cross-section of an exemplary 3D memory device with stacked device chips using interposers, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

As 3D NAND memory devices continue to scale up vertically (e.g., having 96-layers or more), it may not be feasible to enable one-step etching of high aspect ratio structures, such as channel holes and gate line slits (GLSs), due to dry etching challenges. Especially, for small-size patterns like channel holes, critical dimension (CD) control and further reduction would benefit cell density increase.

Direct bonding technologies have been proposed to fabricate some 3D NAND memory devices (e.g., having 96-layers or more) by joining peripheral device and memory array on different substrates. However, direct bonding processes may cause yield loss and additional cost, in particular, for more than three device chips to be bonded. Also, direct bonding processes may have a small process tolerance for lithography alignment and overlay, etch stoppability and uniformity control, wet clean, etc.

In some 3D NAND memory devices (e.g., 128-layers or more), a dual-deck structure has been proposed to integrate two decks of memory stacks on the same substrate using a semiconductor inter-deck plug. Similar to using the direct bonding technologies, 3D NAND memory devices using the dual-deck structure suffer from problems, such as small process tolerance, high cost, and low yield due to complex process integration. Moreover, the semiconductor materials used by the inter-deck plug can introduce additional electrical resistance, which can reduce the device performance.

Various embodiments in accordance with the present disclosure provide 3D NAND memory devices with higher cell density, better performance, and improved yield compared with other 3D NAND memory devices described above. By vertically stacking a peripheral device chip and one or more memory array device chips and connecting them using interposers, the cell density of a 3D NAND memory device can be increased without introducing significant process difficulties.

For example, by joining multiple device chips using interposer(s) rather than direct bonding, the 3D NAND memory devices disclosed herein can achieve better CD control and more relaxed lithograph alignment/overlay specification during fabrication, thereby reducing cost and increasing production yield and throughput. Also, the electrical connections formed between different device chips using interposers can have a lower electrical resistance than those of semiconductor inter-deck plugs in a dual-deck structure. Moreover, the 3D NAND memory devices using interposers and fabrication methods thereof disclosed herein have high process extensibilities for devices with three or more device chips integrated vertically, which have even higher cell density.

FIG. 1 illustrates a cross-section of an exemplary 3D memory device 100 with stacked device chips using interposers, according to some embodiments of the present disclosure. As shown in FIG. 1, 3D memory device 100 can be a three-level memory device including one peripheral device chip and two memory array device chips stacked vertically as well as electrically and mechanically connected using two interposers. It is understood that interposers can provide flexibility of connecting any number of device chips in any vertical arrangement to increase the cell density and production yield of 3D memory device 100. For example, 3D memory device 100 can have more than two memory array device chips to further increase the cell density, and the peripheral device chip can be disposed at the bottom, at the top, or in the middle of 3D memory device 100.

In some embodiments, 3D memory device 100 includes a peripheral device chip 102, a first memory array device chip 142, and a first interposer 124 disposed vertically between peripheral device chip 102 and first memory array device chip 142, together forming a two-level memory device 170 as shown FIG. 1. To be electrically and mechanically coupled together, peripheral device chip 102 can include a set of chip contacts 110 on its top surface, first interposer 124 can include a first set of interposer contacts 130 on its top surface and a second set of interposer contacts 120 on its bottom surface, and first memory array device chip 142 can include a set of chip contacts 140 on its bottom surface. Solder bumping is applied to attach each pair of interposer contact and chip contact, according to some embodiments.

As shown in FIG. 1, peripheral device chip 102 can include a chip substrate 104, a peripheral device 106, an interconnect layer 108, and chip contacts 110. Chip substrate 104 can include silicon (e.g., single crystalline silicon), silicon germanium (SiGe), gallium arsenide (GaAs), germanium (Ge), silicon on insulator (SOI), or any other suitable materials. Peripheral device 106 can be formed "on" chip substrate 104, in which the entirety or part of peripheral device 106 is formed in chip substrate 104 (e.g., below the top surface of chip substrate 104) and/or directly on chip substrate 104. Peripheral device 106 can include a plurality of transistors 107 formed on chip substrate 104. Peripheral device 106 can further include isolation regions (e.g., shallow trench isolations (STIs)) and doped regions (e.g., source regions and drain regions of transistors 107) as well. In some embodiments, peripheral device chip 102 is flipped upside down, and peripheral device 106 is thus disposed below chip substrate 104.

In some embodiments, peripheral device 106 can include any suitable digital, analog, and/or mixed-signal circuits used for facilitating the operation of 3D memory device 100. For example, peripheral device 106 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, peripheral device 106 are formed on chip substrate 104 using complementary metal-oxide-semiconductor (CMOS) technology (also known as a "CMOS chip").

As shown in FIG. 1, interconnect layer 108 can be formed above peripheral device 106 (referred to herein as a "peripheral interconnect layer") to transfer the electrical signal to and from peripheral device 106. Peripheral interconnect layer 108 can include a plurality of interconnects, including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Peripheral interconnect layer 108 can further include one or more interlayer dielectric (ILD) layers (also known as "intermetal dielectric (IMD) layers") in which interconnect lines and via contacts can form. The interconnects in peripheral interconnect layer 108 can include conductive materials including, but not limited to, tungsten (W), cobalt (Co), copper (Cu), aluminum (Al), silicides, or any combination thereof. The ILD layers in peripheral interconnect layer 108 can include dielectric materials including, but not limited to, silicon oxide, silicon nitride, silicon oxynitride, low dielectric constant (low-k) dielectrics, or any combination thereof.

It is noted that x and y axes are added in FIG. 1 to further illustrate the spatial relationship of the components in 3D memory device 100. Chip substrate 104 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., peripheral device chip 102) is determined relative to the substrate of the semiconductor device (e.g., chip substrate 104) in the y-direction (the vertical direction or thickness direction) when the substrate is positioned in the lowest plane of the semiconductor device in the y-direction. The same notion for describing spatial relationship is applied throughout the present disclosure.

As shown in FIG. 1, chip contacts 110 can be formed on the top surface of peripheral device chip 102 and electrically connected to peripheral device 106, for example, through the interconnects in peripheral interconnect layer 108. Chip contacts 110 can transfer the electrical signal to and from peripheral device chip 102. Chip contacts 110 can also serve as an interface to promote adhesion between peripheral device chip 102 and first interposer 124. In some embodiments, chip contacts 110 are conductive pads that include one or more thin film layers with high affinity to, for example, solder materials (also known as "solder pads"). The thin film layers can include conductors, such as Al, Au, Cu, Cr, Ni, TiW or any combination thereof. In some embodiments, the conductive pad has a dimension ranging between about 100 nm and about 1 such as between 100 nm and 1 μm (e.g., 100 nm, 200 nm, 300 nm, 400 nm, 500 nm, 600 nm, 700 nm, 800 nm, 900 nm, 1 μm, any range bounded by the lower end by any of these values, or in any range defined by any two of these values). In some embodiments, chip contacts 110 are conductive bumps, such as solder bumps (not shown) on solder pads. The solder bump materials can include, but not limited to, alloys such as 63Sn/Pb, Cu/Sb/Ag/Sn, and 95.5Sn/3.8Ag/0.7Cu. In some embodiments, the conductive bump has a dimension ranging between about 1 μm and about 100 μm, such as between 1 μm and 100 μm (e.g., 1 μm, 5 μm, 10 μm, 20 μm, 30 μm, 40 μm, 50 μm, 60 μm, 70 μm, 80 μm, 90 μm, 100 μm, any range bounded by the lower end by any of these values, or in any range defined by any two of these values).

An interposer can serve as an interfacial joining device that brings in extra benefits in the process of forming a 3D memory device. For example, an interposer can have a very smooth surface, such that the surface flatness requirement of the other mating device chip is less stringent. An interposer can also serve as a thermal spreader so that heat can be applied evenly during the joining process. An interposer can further act as a good heat sink during the operation of a 3D memory device, thereby preventing it from overheating.

As shown in FIG. 1, first interposer 124 of 3D memory device 100 can include an interposer substrate 121, a plurality of through substrate via contacts 126, a first set of interposer contacts 130, and a second set of interposer contacts 120. First and second sets of interposer contacts 130 and 120 can be formed on opposite surfaces of first interposer 124, for example, the top surface and the bottom surface, respectively. In some embodiments, first interposer 124 can further include two redistribution layers 122 and 128 disposed on opposite surfaces of interposer substrate 121 as well, for example, the top surface and the bottom surface, respectively. In some embodiments, first redistribution layer 128 is formed on the top surface of interposer substrate 121 and between first set of interposer contacts 130 and interposer substrate 121. First redistribution layer 128 can be in contact with first set of interposer contacts 130. In some embodiments, second redistribution layer 122 is formed on the bottom surface of interposer substrate 121 and between second set of interposer contacts 120 and interposer substrate 121. Second redistribution layer 122 can be in contact with second set of interposer contacts 120. It is understood that in some embodiments, first interposer 124 includes only one redistribution layer formed on either top or bottom surface of interposer substrate 121, such as first redistribution layer 128 or second redistribution layer 122. It is further understood that in some embodiments, first interposer 124 does not include any redistribution layer.

By using through substrate via contacts 126, electrical signals can transfer vertically (in y-direction) between first set of interposer contacts 130 and second set of interposer contacts 120 through interposer substrate 121. Through substrate via contacts 126 are also known as "through silicon vias" (TSVs) if interposer substrate 121 is made of silicon. Each through substrate via contact 126 can extend through interposer substrate 121 and electrically connect to first and second redistribution layers 128 and 122 and first and second sets of interposer contacts 130 and 120. The inclusion of first redistribution layer 128 and/or second redistribution layer 122 can further enable the electrical signals to transfer laterally (in x-direction) and thus, bond out from different locations on the device chip. Redistribution layers 122 and 128 can include interconnects formed in one or more ILD layers for interconnect routing.

In some embodiments, interposer substrate 121 includes materials such as single crystalline silicon, ceramic, glass, or any other suitable materials. Through substrate via contacts 126 can include conductive materials, such as Al, Cu, W, or any other suitable materials, filled in via openings through the entire thickness of interposer substrate 121. In some embodiments, interposer contacts 120 and 130 are conductive pads, such as solder pads. The conductive pads can include conductors including Al, Au, Cu, Cr, Ni, TiW or any combination thereof. In some embodiments, a conductive pad has a dimension ranging between about 100 nm and about 1 μm, such as between 100 nm and 1 μm (e.g., 100 nm, 200 nm, 300 nm, 400 nm, 500 nm, 600 nm, 700 nm, 800 nm, 900 nm, 1 μm, any range bounded by the lower end by any of these values, or in any range defined by any two of these values). In some embodiments, interposer contacts 120 and 130 are conductive bumps, such as solder bumps (not shown) on solder pads. The solder bump materials can include, but not limited to, alloys such as 63Sn/Pb, Cu/Sb/Ag/Sn, and 95.5Sn/3.8Ag/0.7Cu. In some embodiments, a conductive bump has a dimension ranging between about 1 μm and about 100 μm, such as between 1 μm and 100 μm (e.g., 1 μm, 5 μm, 10 μm, 20 μm, 30 μm, 40 μm, 50 μm, 60 μm, 70 μm, 80 μm, 90 μm, 100 μm, any range bounded by the lower end by any of these values, or in any range defined by any two of these values).

Interposer contacts 120 and 130 are shown in ball-shapes in FIG. 1. This is to illustrate that in some embodiments, the appearance of interposer contact 120 or 130 is dominated by the conductive bump due to its enlarged size, even if interposer contact 120 or 130 is actually formed by a conductive bump on a conductive pad. Unless specified otherwise, the combination of a conductive pad and a conductive bump will be referred to herein as a "conductive bump."

As shown in FIG. 1, upon completion of the joining process, each interposer contact 120 (e.g., a conductive bump) can attach to (e.g., fused firmly with) corresponding chip contact 110 (e.g., a conductive pad) of peripheral device chip 102. It is understood that the opposite arrangement is feasible in that chip contacts 110 are conductive bumps and interposer contacts 120 are conductive pads. As interposer contacts 120 and chip contacts 110 can include conductors, the joining of interposer contacts 120 and chip contacts 110 can form low-resistance electrical contacts (e.g., metal-metal contacts) between peripheral device chip 102 and first interposer 124. The joining of interposer contacts 120 and chip contacts 110 can also provide adhesion between peripheral device chip 102 and first interposer 124 with suitable mechanical strength.

As shown in FIG. 1, first memory array device chip 142 of 3D memory device 100 can include a chip substrate 144, an alternating conductor/dielectric stack 152, an interconnect layer 154 (referred to herein as an "array interconnect layer"), a plurality of bottom chip contacts 140 on the bottom surface of first memory array device chip 142, and a plurality of top chip contacts 156 on the top surface of first memory array device chip 142. Top chip contacts 156 and alternating conductor/dielectric stack 152 are disposed on the same side of chip substrate 144, and bottom chip contacts 140 and alternating conductor/dielectric stack 152 are disposed on different sides of chip substrate 144. Chip substrate 144 can include silicon (e.g., single crystalline silicon), SiGe, GaAs, Ge, SOI, or any other suitable materials.

In some embodiments, alternating conductor/dielectric stack 152 includes a plurality of pairs each including a conductor layer and a dielectric layer. Alternating conductor/dielectric stack 152 can be formed on chip substrate 144. In some embodiments, first memory array device chip 142 is flipped upside down, and alternating conductor/dielectric stack 152 is thus disposed below chip substrate 144. Conductor layers and dielectric layers in alternating conductor/dielectric stack 152 can alternate in the vertical direction. Conductor layers can include conductive materials including, but not limited to, W, Co, Cu, Al, doped silicon, silicides, or any combination thereof. Dielectric layers can include dielectric materials including, but not limited to, silicon oxide, silicon nitride, silicon oxynitride, or any combination thereof. As shown in FIG. 1, first memory array device chip 142 can also include word line via contacts 153 that provide electrical connections to the control gates of NAND memory strings 150. Each word line via contact 153 can have its lower end in contact with a conductor layer in alternating conductor/dielectric stack 152 to individually address a word line of first memory array device chip 142.

In some embodiments, first memory array device chip 142 is a NAND Flash memory chip in which memory cells are provided in the form of an array of NAND memory strings 150 formed on chip substrate 144. Each NAND memory string 150 can extend vertically through alternating conductor/dielectric stack 152 and include a plurality of memory cells connected vertically in series. The ability to form memory cells vertically (i.e., in y-direction) effectively increases the memory density per chip area. In some embodiments, each NAND memory string 150 includes a semiconductor channel and a dielectric layer (known as a "memory film"). The semiconductor channel can extend vertically through alternating conductor/dielectric stack 152 and include silicon, such as amorphous silicon, polysilicon, or single crystalline silicon. The dielectric layer can be a composite layer including a tunneling layer, a storage layer (also known as "charge trap/storage layer"), and a blocking layer. Each NAND memory string 150 can have a cylinder shape (e.g., a pillar shape). The semiconductor channel, the tunneling layer, the storage layer, and the blocking layer are arranged along a direction from the center toward the outer surface of the pillar in this order, according to some embodiments. For example, the tunneling layer is disposed between the alternating conductor/dielectric stack and the semiconductor channel, and the storage layer is disposed between the tunneling layer and alternating conductor/dielectric stack 152. The tunneling layer can include silicon oxide, silicon nitride, or any combination thereof. The storage layer can include silicon nitride, silicon oxynitride, silicon, or any combination thereof. The blocking layer can include silicon oxide, silicon nitride, high dielectric constant (high-k) dielectrics, or any combination thereof.

As shown in FIG. 1, array interconnect layer 154 can be disposed above alternating conductor/dielectric stack 152 and NAND memory strings 150 therein. Array interconnect layer 154 can include a plurality of interconnects, including interconnect lines and via contacts formed in one or more ILD layers. In some embodiments, the interconnects in array interconnect layer 154 include local interconnects (e.g., bit line via contacts) each having its lower end in contact with the upper end of corresponding NAND memory string 150. In some embodiments, the interconnects in array interconnect layer 154 include back-end-of-line (BEOL) interconnects, at least some of which have their upper ends in contact with top chip contacts 156. The BEOL interconnects thus can provide electrical connections between the components in alternating conductor/dielectric stack 152 (e.g., NAND memory strings 150) and top chip contacts 156.

In some embodiments, first memory array device chip 142 includes one and more through array contacts (TACs) 146 that extend vertically through alternating conductor/dielectric stack 152. TAC 146 can extend through the entirety of alternating conductor/dielectric stack 152 and at least part of chip substrate 144. TAC 146 can entail electrical signals originated from the components in alternating conductor/dielectric stack 152 (e.g., NAND memory strings 150) to be routed to bottom chip contacts 140 and/or top chip contacts 156. TAC 146 can also provide electrical connections between bottom chip contacts 140 and top chip contacts 156. For example, the lower end of TAC 146 is in contact with bottom chip contact 140, and the upper end of TAC 146 is in contact with an interconnect in array interconnect layer 154. As shown in FIG. 1, first memory array device chip 142 can also include through substrate via contacts 147 (e.g., TSVs) extending vertically through the entire thickness of chip substrate 144, which can provide electrical connections between the components in alternating conductor/dielectric stack 152 (e.g., NAND memory strings 150) and bottom chip contacts 140.

Top and bottom chip contacts 156 and 140 can be electrically connected to NAND memory strings 150 through the interconnects in array interconnect layer 154, TACs 146, and/or through substrate via contacts 147. In some embodiments, chip contacts 140 and 156 are conductive pads, such as solder pads. The conductive pads can include conductors including Al, Au, Cu, Cr, Ni, TiW or any combination thereof. In some embodiments, a conductive pad has a dimension ranging between about 100 nm and about 1 μm, such as between 100 nm and 1 μm (e.g., 100 nm, 200 nm, 300 nm, 400 nm, 500 nm, 600 nm, 700 nm, 800 nm, 900 nm, 1 μm, any range bounded by the lower end by any of these values, or in any range defined by any two of these values). In some embodiments, chip contacts 140 and 156 are conductive bumps, such as solder bumps (not shown) on solder pads. The solder bump materials can include, but not limited to, alloys such as 63Sn/Pb, Cu/Sb/Ag/Sn, and 95.5Sn/3.8Ag/0.7Cu. In some embodiments, a conductive bump has a dimension ranging between about 1 μm and about 100 μm, such as between 1 μm and 100 μm (e.g., 1 μm, 5 μm, 10 μm, 20 μm, 30 μm, 40 μm, 50 μm, 60 μm, 70 μm, 80 μm, 90 μm, 100 μm, any range bounded by the lower end by any of these values, or in any range defined by any two of these values).

As shown in FIG. 1, upon completion of the joining process, each interposer contact 130 (e.g., a conductive bump) can attach to (e.g., fused firmly with) corresponding bottom chip contact 140 (e.g., a conductive pad) of first memory array device chip 142. It is understood that the opposite arrangement is feasible in that bottom chip contacts 140 are conductive bumps and interposer contacts 130 are conductive pads. As interposer contacts 130 and bottom chip contacts 140 can include conductors, the joining of interposer contacts 130 and bottom chip contacts 140 can form low-resistance electrical contacts (e.g., metal-metal contacts) between first memory array device chip 142 and first interposer 124. The joining of interposer contacts 130 and bottom chip contacts 140 can also provide adhesion between first memory array device chip 142 and first interposer 124 with suitable mechanical strength. It is understood that in some embodiments, first memory array device chip 142 is first flipped upside down (with top chip contacts 156 facing down toward interposer contacts 130) and then joined with first interposer 124 by attaching top chip contacts 156 to interposer contacts 130.

Consequently, as both peripheral device chip 102 and first memory array device chip 142 can be attached to first interposer 124 on its opposite sides, peripheral device chip 102 and first memory array device chip 142 can be electrically and mechanical coupled by first interposer 124, thereby forming two-level memory device 170. For example, electrical signals originated from transistors 107 in peripheral device chip 102 can be routed to top chip contacts 156 in first memory array device chip 142 with low-resistance electrical contacts by the interconnects in peripheral interconnect layer 108, chip contacts 110, interposer contacts 120, redistribution layer 122, through substrate via contacts 126, redistribution layer 128, interposer contacts 130, bottom chip contacts 140, TACs 146, and the interconnects in array interconnect layer 154. Moreover, by adjusting the dimensions of chip contacts 110 and 140 and interposer contacts 120 and 130 and/or arranging the interconnect routing in redistribution layers 122 and 128, the process difficulties of integrating peripheral device chip 102 and first memory array device chip 142 can be significantly reduced, for example, with better CD control and relaxed lithography alignment and overlay specification.

As shown in FIG. 1, 3D memory device 100 can be a multiple-level memory device, which vertically integrates one peripheral device chip (e.g., peripheral device chip 102) and multiple memory array device chips (e.g., multiple memory array device chips stacked vertically). In some embodiments, 3D memory device 100 is a three-level memory device having a second memory array device chip 172 stacked on top of two-level memory device 170. Second memory array device chip 172 can be electrically and mechanically coupled to two-level memory device 170 by a second interposer 164 disposed vertically between first and second memory array device chips 142 and 172.

Similar to first memory array device chip 142, second memory array device chip 172 can include a chip substrate 184, an alternating conductor/dielectric stack 192, an array of NAND memory strings 190 each extending vertically through alternating conductor/dielectric stack 192, a plurality of word line via contacts 193, a plurality of TACs 186, a plurality of through substrate via contacts 187, and an array interconnect layer 194. To attach to second interposer 164, second memory array device chip 172 can also include a set of bottom chip contacts 196 on the bottom surface. Additionally or optionally, second memory array device chip 172 can include a set of top chip contacts 196 on the top surface to be attached to another interposer (not shown) to further increase the memory array levels of 3D memory device 100. In some embodiments, second memory array chip 172 is a duplicate of first memory array device chip 142 for increasing cell density. Thus, the details of similar structures (e.g., materials, fabrication process, functions, etc.) in both first and second memory array device chips 142 and 172 will be readily appreciated and will not be repeated.

Similar to first interposer 124, second interposer 164 can include an interposer substrate 171, two redistribution layers 162 and 168 formed on opposite surfaces of interposer substrate 171, and a plurality of through substrate via contacts 176. To attach to first and second memory array device chips 142 and 172, second interposer 164 can also include two sets of interposer contacts 160 and 180 disposed on opposite surfaces (e.g., the top and bottom surfaces) of second interposer 162. Interposer contacts 160 and 180 can be attached to top chip contacts 156 of first memory array device chip 142 and bottom chip contacts 196 of second memory array device chip 172, respectively. In some embodiments, second interposer 164 is a duplicate of first interposer 124 for increasing vertical integration capability. Thus, the details of similar structures (e.g., materials, fabrication process, functions, etc.) in both first and second interposers 124 and 164 will be readily appreciated and will not be repeated.

It is understood the device chip joining process using interposers is a repeatable process. With more iterations, 3D memory device 100 with more than three levels can be formed. It is also understood that the relative vertical positions of each level are not limited to the example shown in FIG. 1. For example, peripheral device chip 102 can be the bottom level (as shown in FIG. 1), the top level, or any middle level in a multiple-level memory device. It is further understood that the orientations of each level are not limited to the example shown in FIG. 1. For example, peripheral device chip 102, first memory array device chip 142, and/or second memory array device chip 172 can be flipped upside down in the multiple-level memory device. That is, the active side of a device chip (e.g., the side at which peripheral device or memory array device is formed) can be either facing up or facing down in the multiple-level memory device. When peripheral device chip 102 is at a middle level and/or flipped upside down in the multiple-level memory device, additional chip contacts (not shown) can be formed on the backside of chip substrate 104 accompanied with through substrate via contacts for backside interconnect routing.

For example, FIGS. 2A-2H illustrate schematic views of exemplary 3D memory devices 200 with stacked peripheral device chip and memory array device chips using an interposer, according to various embodiments. As shown in FIG. 2, eight different device chip arrangements can be derived from a two-level 3D memory device 200. 3D memory device 200 can include a peripheral device chip 202, an interposer 208, and a memory array device chip 212. In some embodiments, peripheral device chip 202 further includes an active side 206 on which a peripheral device (e.g., transistors) is formed and a passive side 204 having the chip substrate. Similarly, memory array device chip 212 further includes an active side 216 on which a memory array device (e.g., NAND memory strings) is formed and a passive side 214 having the chip substrate, according to some embodiments. Interposer 208 can include the same patterns on both sides, thus its flipping does not create new variations. Peripheral device chip 202 and memory array device chip 212 can be attached to opposite sides of interposer 208, respectively, and thus be electrically and mechanically coupled by interposer 208 to form 3D memory device 200, as described above in detail with respect to FIG. 1.

Figure 2A:
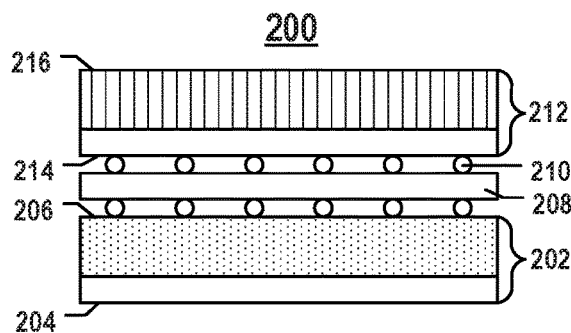
FIGS. 2A-2H illustrate schematic views of exemplary 3D memory devices with stacked peripheral device chip and memory array device chip using an interposer, according to various embodiments.
Figure 2B:
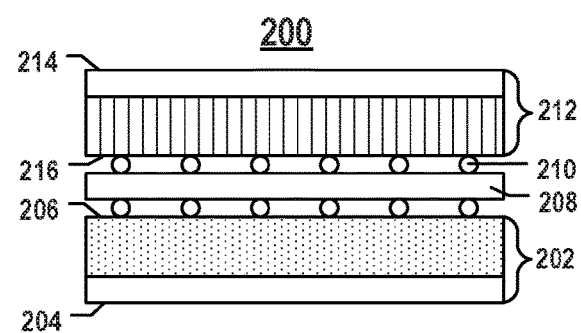
Figure 2C:
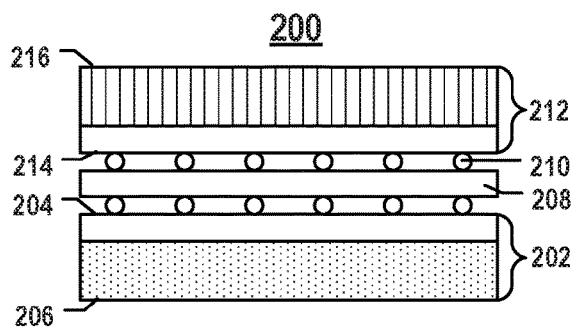
Figure 2D:
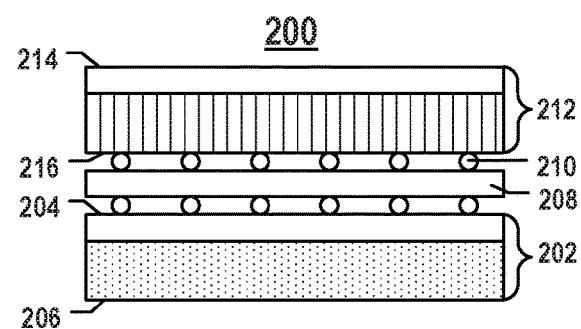
Figure 2E:
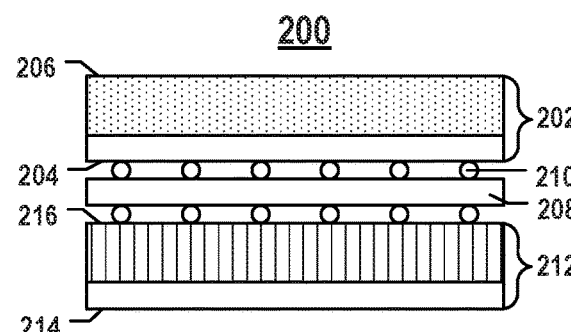
Figure 2F:
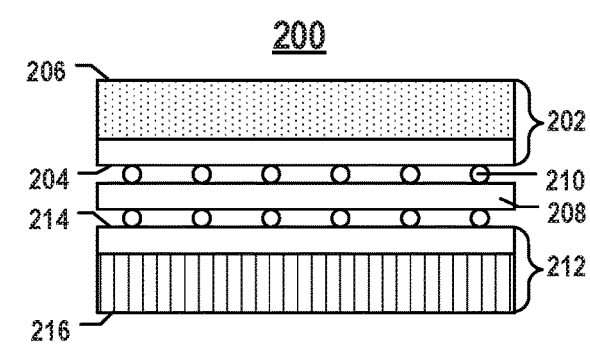
Figure 2G:
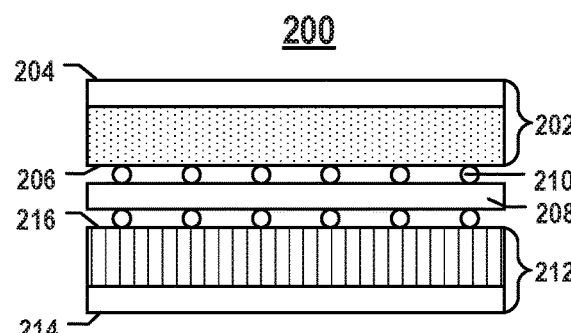
Figure 2H:
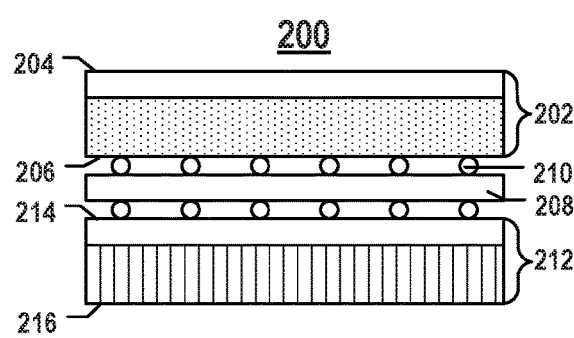

In FIG. 2A, the joined peripheral device chip 202 and memory array device chip 212 each has its active side 216 and 206 facing up and its passive side 214 and 204 facing down. Peripheral device chip 202 is disposed below memory array device chip 212. Using FIG. 2A as the basis arrangement, 3D memory device 200 in FIG. 2B is formed by flipping memory array device chip 212 upside down; 3D memory device 200 in FIG. 2C is formed by flipping peripheral device chip 202 upside down; 3D memory device 200 in FIG. 2D is formed by flipping both peripheral device chip 202 and memory array device chip 212 upside down. Furthermore, 3D memory devices 200 in FIGS. 2E-2H are formed by swapping the vertical positions of memory array device chip 212 and peripheral device chip 202 from 3D memory devices 200 in FIGS. 2A-2D, respectively.

In each of FIGS. 2A-2H, each contact 210 of 3D memory device 200 includes a chip contact formed on an outer surface of peripheral device chip 202 or memory array device chip 212 and an interposer contact formed on an outer surface at either side of interposer 208. The chip contact and interposer contact can be attached (e.g., fused) to form contact 210. It is understood that contact 210 can be either in the form of two attached conductive bumps, or one conductive pad attached to one conductive bump. The ball-shape of contact 210 in FIGS. 2A-2H is for the sake of simplicity and does not limit the feasible type of attached chip contact and interposer contact.

In some embodiments, interposers can be used to attach only memory array device chips in the vertically direction. For example, FIGS. 3A-3D illustrate schematic views of exemplary 3D memory devices 300 with stacked memory array device chips using an interposer, according to various embodiments. As shown in FIG. 3, four device chip arrangements can be derived from a two-level 3D memory device 300 (omitting the peripheral device). It is understood that the peripheral device can be electrically and mechanically coupled to the stacked memory array device chips by any other suitable approaches, such as direct bonding, forming on the same chip substrate of a memory array device chip, or lateral chip integration.

3D memory device 300 can include a first memory array device chip 302, an interposer 308, and a second memory array device chip 312. In some embodiments, first memory array device chip 302 further includes an active side 306 on which a memory array device (e.g., NAND memory strings) is formed and a passive side 304 having the chip substrate. Similarly, second memory array device chip 312 further includes an active side 316 on which a memory array device (e.g., NAND memory strings) is formed and a passive side 314 having the chip substrate, according to some embodiments. Interposer 308 can include the same patterns on both sides, thus its flipping does not create new variations. First memory array device chip 302 and second memory array device chip 312 can be attached to opposite sides of interposer 308, respectively, and thus be electrically and mechanically coupled by interposer 308 to form 3D memory device 300, as described above in detail with respect to FIG. 1.

Figure 3A:
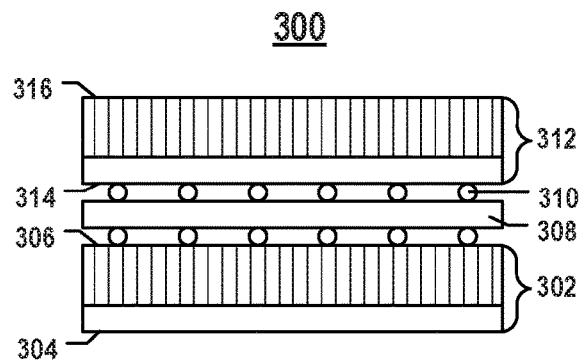
FIGS. 3A-3D illustrate schematic views of exemplary 3D memory devices with stacked memory array device chips using an interposer, according to various embodiments.
Figure 3B:
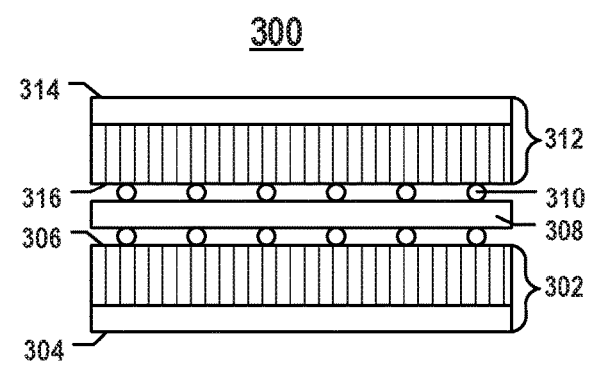
Figure 3C:
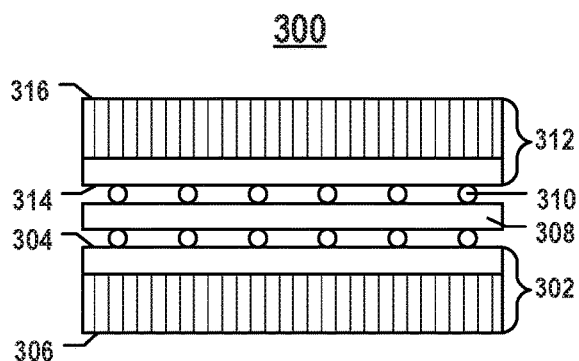
Figure 3D:
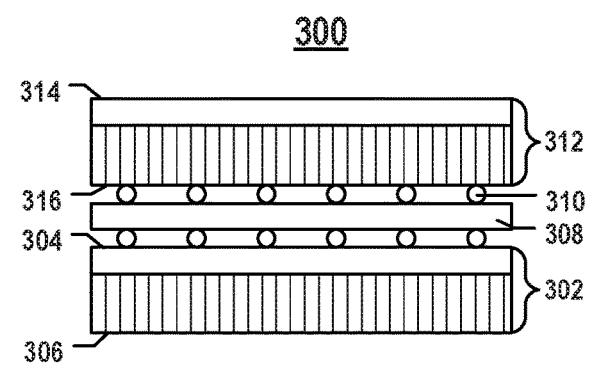

In FIG. 3A, the joined first and second memory array device chips 302 and 312 each has its active side 316 and 306 facing up and its passive side 314 and 304 facing down. Using FIG. 3A as the basis arrangement, 3D memory device 300 in FIG. 3B is formed by flipping second memory array device chip 312 upside down; 3D memory device 300 in FIG. 3C is formed by flipping first memory array device chip 302 upside down; 3D memory device 300 in FIG. 3D is formed by flipping both first and second memory array device chips 302 and 312 upside down.

In each of FIGS. 3A-3D, each contact 310 of 3D memory device 300 includes a chip contact formed on an outer surface of first or second memory array device chip 302 or 312 and an interposer contact formed on an outer surface at either side of interposer 308. The chip contact and interposer contact can be attached (e.g., fused) to form contact 310. It is understood that contact 310 can be either in the form of two attached conductive bumps, or one conductive pad attached to one conductive bump. The ball-shape of contact 310 in FIGS. 3A-3D is for the sake of simplicity and does not limit the feasible type of attached chip contact and interposer contact.

Figure 8:
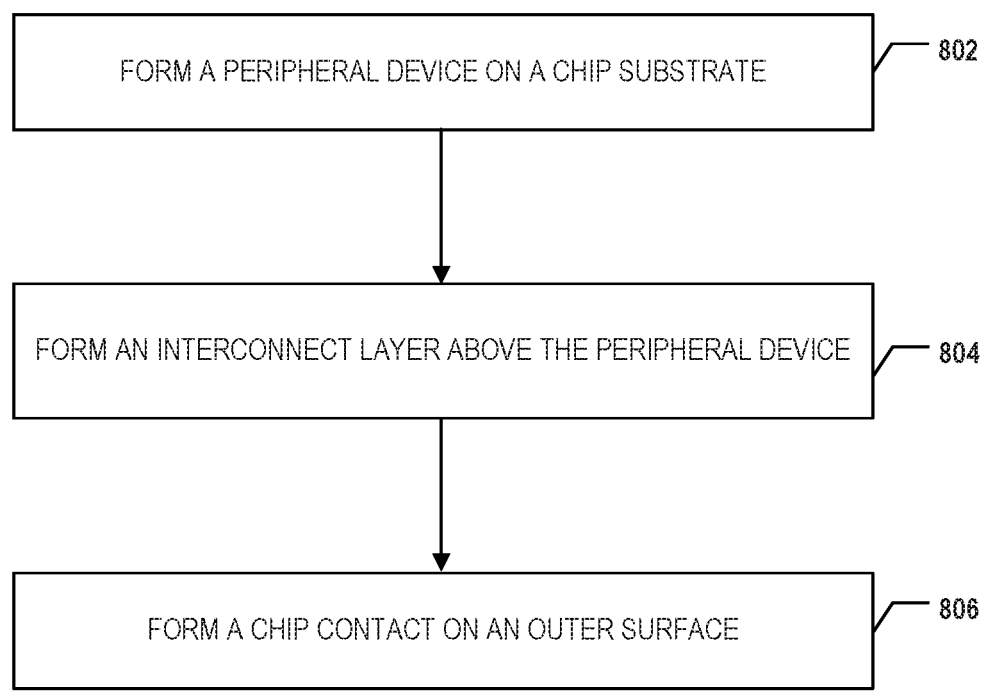
FIG. 8 is a flowchart of an exemplary method for forming a peripheral device chip, according to some embodiments.

FIGS. 4A-4D illustrate an exemplary fabrication process for forming a peripheral device chip, according to some embodiments of the present disclosure. FIG. 8 is a flowchart of an exemplary method 800 for forming a peripheral device chip, according to some embodiments. Examples of the peripheral device chip depicted in FIGS. 4A-4D and FIG. 8 include peripheral device chip 102 depicted in FIG. 1. FIGS. 4A-4D and FIG. 8 will be described together. It should be understood that the operations shown in method 800 are not exhaustive and that other operations can be performed as well before, after, or between any of the illustrated operations. Further, some of the operations may be performed simultaneously, or in a different order than shown in FIG. 8.

Figure 4A:
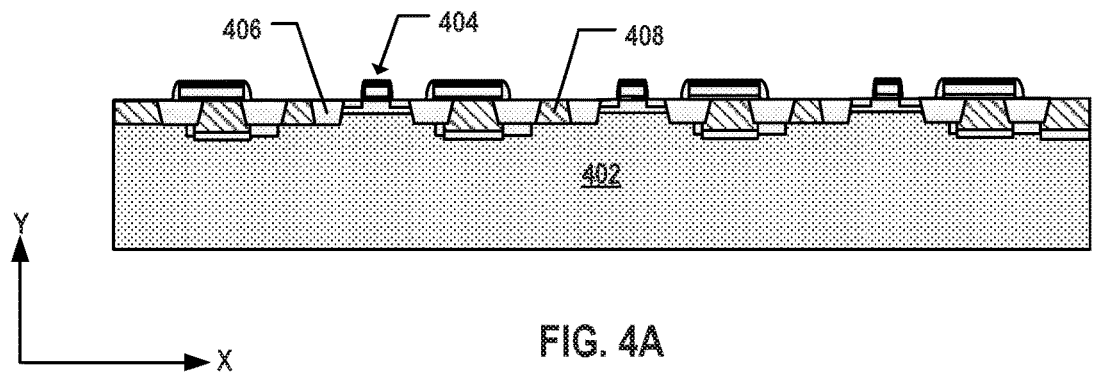
FIGS. 4A-4D illustrate an exemplary fabrication process for forming a peripheral device chip, according to some embodiments.

Referring to FIG. 8, method 800 starts at operation 802, in which a peripheral device is formed on a chip substrate. The chip substrate can be a silicon substrate. As illustrated in FIG. 4A, a peripheral device is formed on a silicon substrate 402. The peripheral device can include a plurality of transistors 404 formed on silicon substrate 402. Transistors 404 can be formed by a plurality of processing steps including, but not limited to, photolithography, dry/wet etch, thin film deposition, thermal growth, implantation, chemical mechanical polishing (CMP), or any combination thereof. In some embodiments, doped regions 406 are formed in silicon substrate 402 by ion implantation and/or thermal diffusion, which function, for example, as source regions and/or drain regions of transistors 404. In some embodiments, isolation region 408 (e.g., STIs) are also formed in silicon substrate 402 by wet/dry etch and thin film deposition.

Figure 4B:
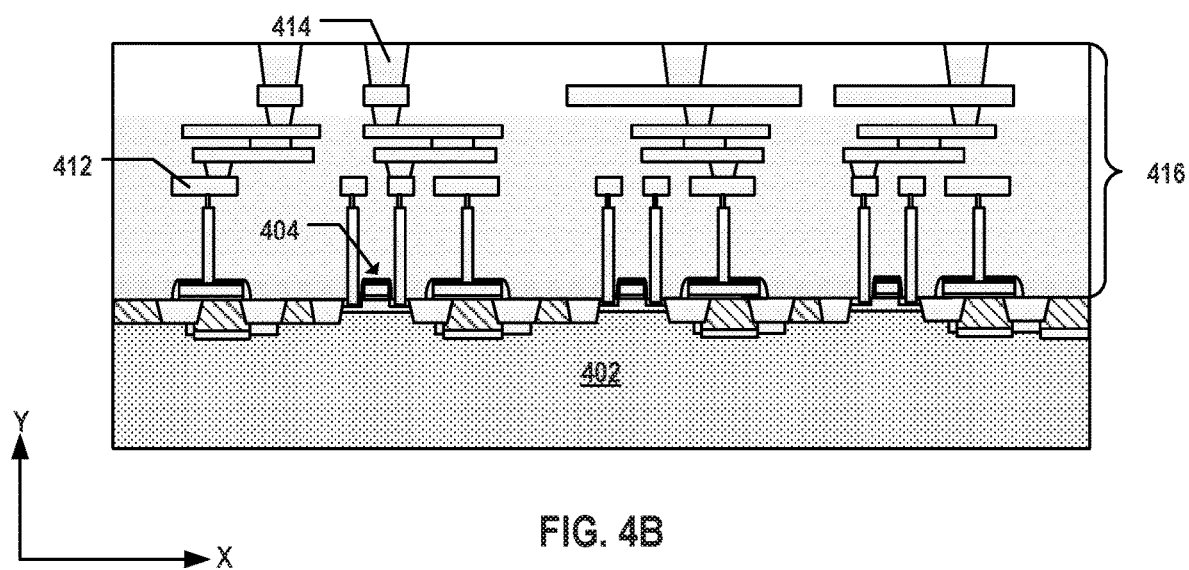

Method 800 proceeds to operation 804, as illustrated in FIG. 8, in which an interconnect layer (e.g., a peripheral interconnect layer) is formed above the peripheral device. The peripheral interconnect layer can include a plurality of interconnects formed in one or more ILD layers. As illustrated in FIG. 4B, a peripheral interconnect layer 416 can be formed on silicon substrate 402 and above transistors 404. Peripheral interconnect layer 416 can include interconnects, including interconnect lines 412 and via contacts 414 of middle-end-of-line (MEOL) and/or BEOL in a plurality of ILD layers, to make electrical connections with the peripheral device (e.g., transistors 404).

In some embodiments, peripheral interconnect layer 416 includes multiple ILD layers and interconnects therein formed in multiple processes. For example, interconnect lines 412 and via contacts 414 can include conductive materials deposited by one or more thin film deposition processes including, but not limited to, CVD, PVD, ALD, electroplating, electroless plating, or any combination thereof. Fabrication processes to form interconnect lines 412 and via contacts 414 can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 4B can be collectively referred to as an "interconnect layer" (e.g., peripheral interconnect layer 416).

Figure 4C:
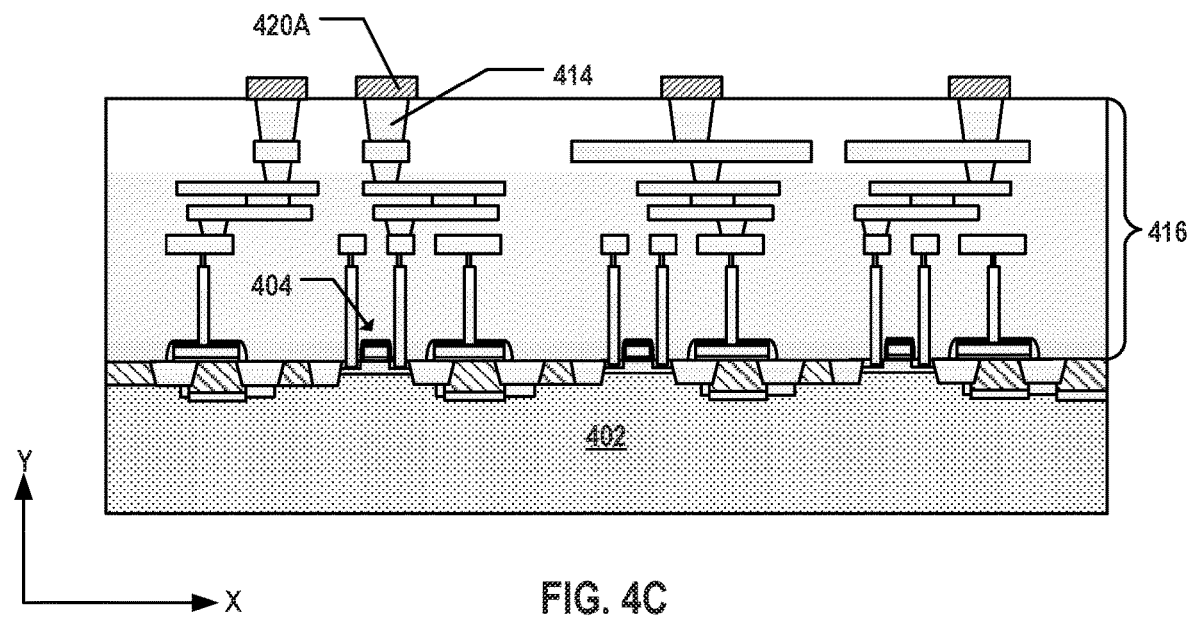

Method 800 proceeds to operation 806, as illustrated in FIG. 8, in which a chip contact (e.g., a top chip contact) is formed on an outer surface (e.g., the top surface) of the peripheral device chip. As shown in FIG. 4C, a set of top chip contacts 420A are formed on the top surface of peripheral interconnect layer 416. Top chip contacts 420A can make electrical connections with the peripheral device (e.g., transistors 404) through the interconnects (e.g., via contacts 414) in peripheral interconnect layer 416. In some embodiments, each top chip contact 420A includes a conductive pad having one or more conductor films, such as a solder pad. The conductor films can include, but not limited to, Al, Au, Cu, Cr, Ni, TiW or any combination thereof. The conductive pad can be deposited by one or more thin film deposition processes including, but not limited to, CVD, PVD, ALD, electroplating, electroless plating, or any combination thereof. Fabrication processes to form the conductive pad can also include photolithography, wet/dry etch, etc.

Figure 4D:
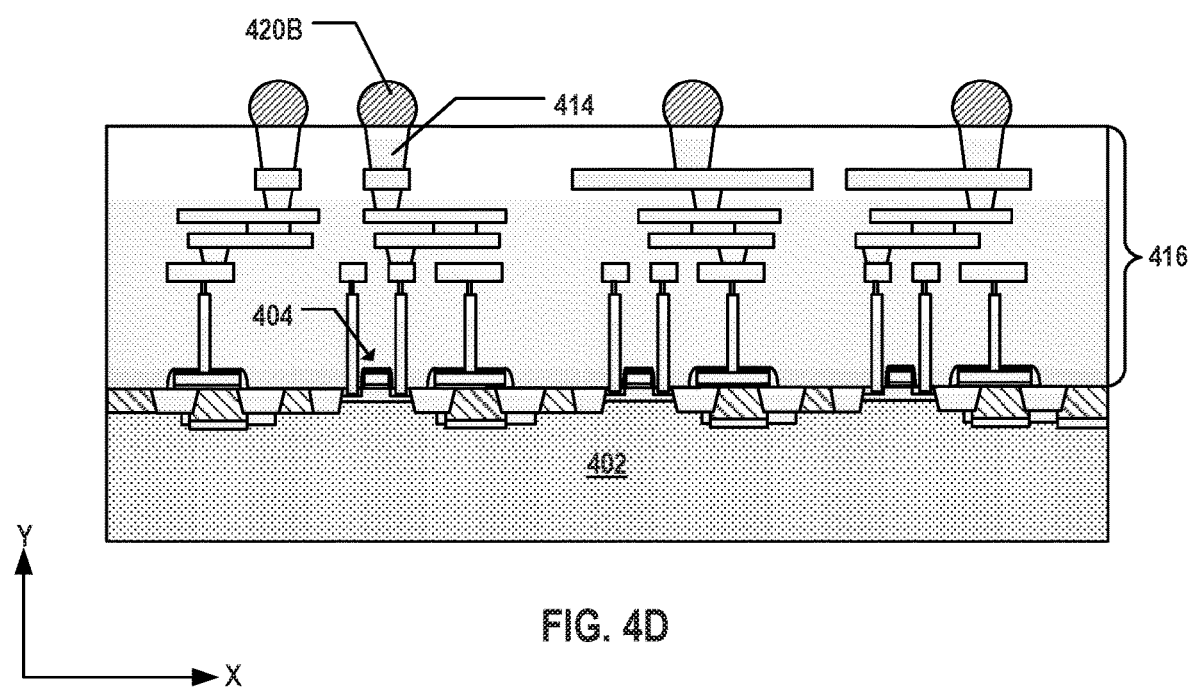

In some embodiments, as shown in FIG. 4D, a set of top chip contacts 420B are formed on the top surface of peripheral interconnect layer 416. Each top chip contact 420B can include a conductive bump, such as a solder conductor deposited on a solder pad (collectively known as a "solder bump"). The solder bump materials can include, but not limited to, alloys such as 63Sn/Pb, Cu/Sb/Ag/Sn, and 95.5Sn/3.8Ag/0.7Cu. The solder conductor can be deposited by bulk film deposition processes including, but not limited to, CVD, PVD, electroplating, electroless plating, or any combination thereof. A thermal reflow process can be applied afterwards to assist forming the solder bump in a round-shape. Fabrication processes to form the conductive bump can also include photolithography, wet/dry etch, etc.

Figure 9:
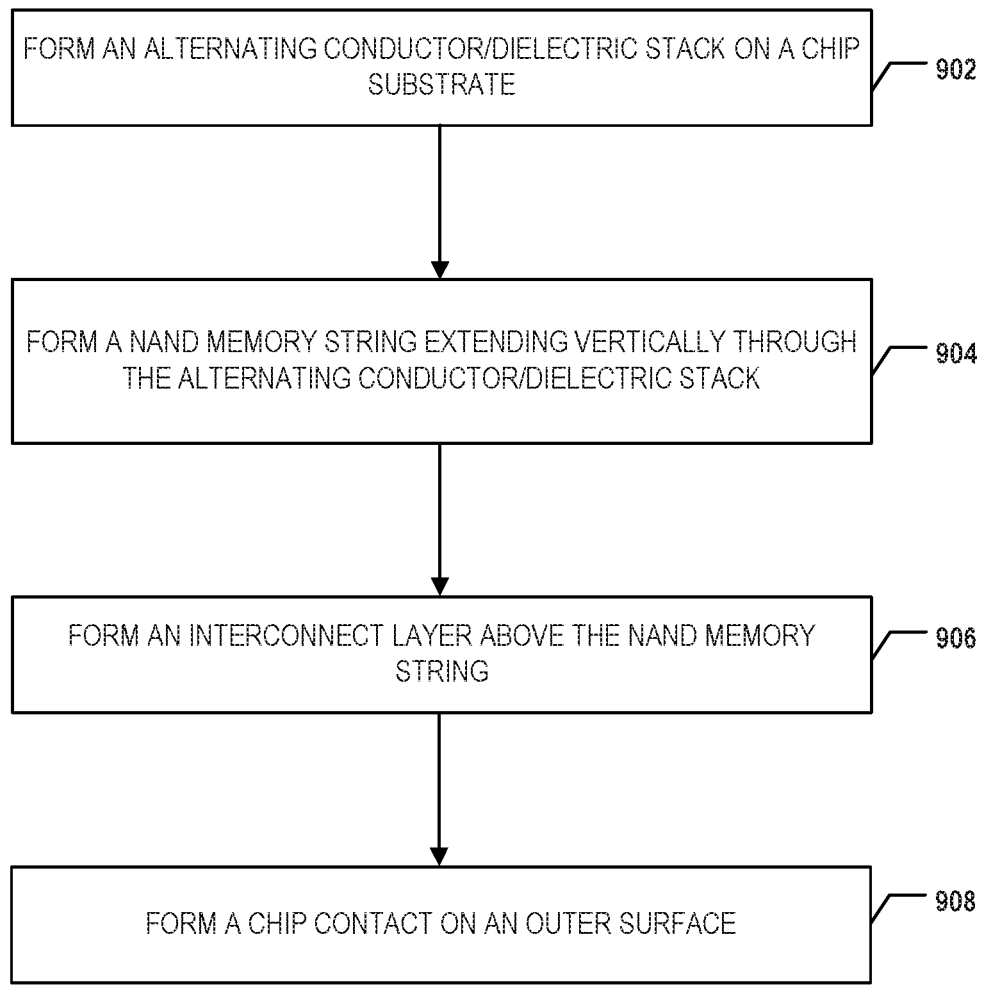
FIG. 9 is a flowchart of an exemplary method for forming a memory array device chip, according to some embodiments.

FIGS. 5A-5G illustrate an exemplary fabrication process for forming a memory array device chip, according to some embodiments of the present disclosure. FIG. 9 is a flowchart of an exemplary method 900 for forming a memory array device chip, according to some embodiments. Examples of the memory array device chip depicted in FIGS. 5A-5G and FIG. 9 include first and second memory array device chips 142 and 172 depicted in FIG. 1. FIGS. 5A-5G and FIG. 9 will be described together. It should be understood that the operations shown in method 900 are not exhaustive and that other operations can be performed as well before, after, or between any of the illustrated operations. Further, some of the operations may be performed simultaneously, or in a different order than shown in FIG. 9.

Figure 5A:
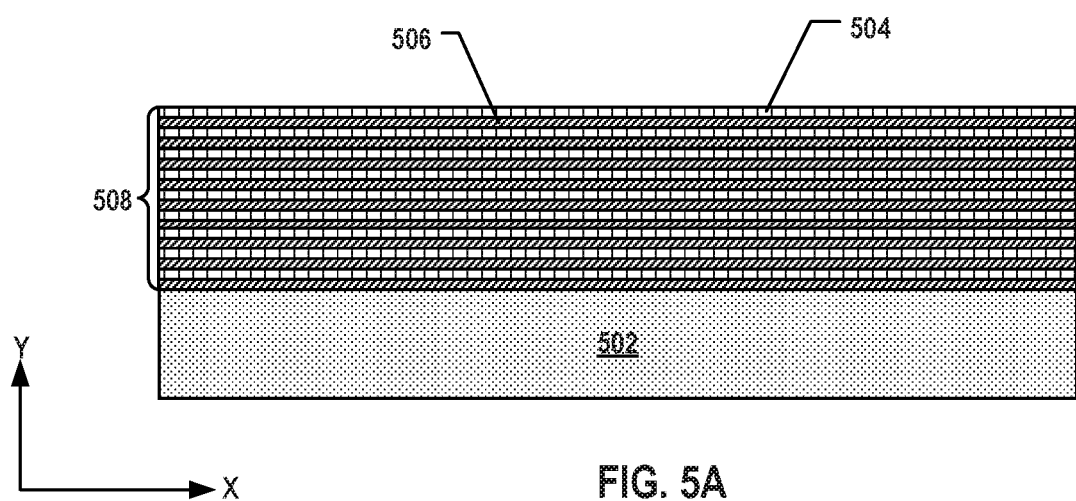
FIGS. 5A-5G illustrate an exemplary fabrication process for forming a memory array device chip, according to some embodiments.

Referring to FIG. 9, method 900 starts at operation 902, in which an alternating dielectric conductor/dielectric stack is formed on a chip substrate. As illustrated in FIG. 5A, pairs of first dielectric layer 504 and second dielectric layer 506 (referred to herein as "dielectric layer pairs") are formed on a silicon substrate 502. The stacked dielectric layer pairs can form an alternating dielectric stack 508. Alternating dielectric stack 508 can include an alternating stack of first dielectric layer 504 and second dielectric layer 506 that is different from first dielectric layer 504. In some embodiments, each dielectric layer pair includes a layer of silicon nitride and a layer of silicon oxide. In some embodiments, first dielectric layers 504 can each have the same thickness or have different thicknesses. Similarly, second dielectric layers 506 can each have the same thickness or have different thicknesses. Alternating dielectric stack 508 can be formed by one or more thin film deposition processes including, but not limited to, CVD, PVD, ALD, or any combination thereof.

Figure 5B:
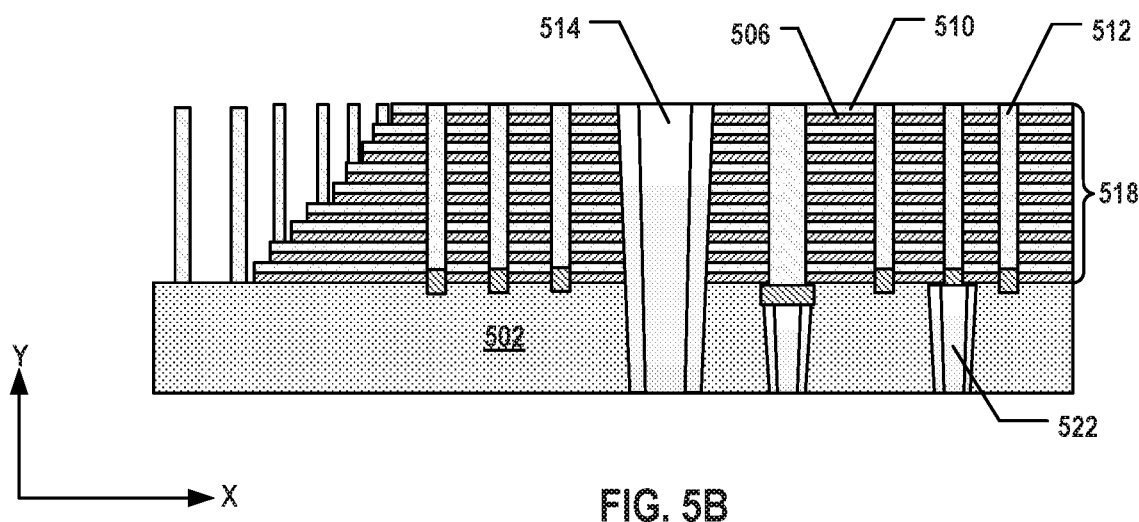

In some embodiments, alternating dielectric stack 508 can be replaced by a plurality of conductor/dielectric layer pairs, i.e., an alternating stack of a conductor layer (e.g., polysilicon) and a dielectric layer (e.g., silicon oxide). As illustrated in FIG. 5B, each first dielectric layer 504 of alternating dielectric stack 508 can be replaced by a conductor layer 510, thereby forming a plurality of conductor/dielectric layer pairs in an alternating conductor/dielectric stack 518. The replacement of first dielectric layers 504 with conductor layers 510 can be performed by wet/dry etch of first dielectric layers 504 selective to second dielectric layers 506 and filling the structure with conductor layers 510. Conductor layers 510 can include conductive materials including, but not limited to, W, Co, Cu, Al, doped silicon, polysilicon, silicides, or any combination thereof. Conductor layers 510 can be filled by thin film deposition processes, such as CVD, ALD, any other suitable process, or any combination thereof.

Method 900 proceeds to operation 904, as illustrated in FIG. 9, in which a plurality of NAND memory strings are formed on the chip substrate. Each NAND memory string can extend vertically through the alternating conductor/dielectric stack. As illustrated in FIG. 5B, a plurality of NAND memory strings 512 are formed on silicon substrate 502. In some embodiments, fabrication processes to form NAND memory strings 512 include forming a semiconductor channel that extends vertically through alternating conductor/dielectric stack 518. In some embodiments, fabrication processes to form NAND memory strings 512 further include forming a dielectric layer between the semiconductor channel and alternating conductor/dielectric stack 518. The dielectric layer can be a composite dielectric layer, such as a combination of multiple dielectric layers including, but not limited to, a tunneling layer, a storage layer, and a blocking layer. The tunneling layer can include dielectric materials including, but not limited to, silicon oxide, silicon nitride, silicon oxynitride, or any combination thereof. The storage layer can include materials for storing charge for memory operation. The storage layer materials can include, but not limited to, silicon nitride, silicon oxynitride, a combination of silicon oxide and silicon nitride, or any combination thereof. The semiconductor channel and dielectric layer (including the tunneling layer and the storage layer therein) can be formed by processes such as ALD, CVD, PVD, any other suitable processes, or any combination thereof.

In some embodiments, operation 904 further includes forming one or more TACs each extending vertically through the alternating conductor/dielectric stack. As illustrated in FIG. 5B, a TAC 514 is formed extending vertically through alternating conductor/dielectric stack 518 and at least part of silicon substrate 502. In some embodiments, fabrication processes to form TAC 514 include forming a vertical opening through alternating conductor/dielectric stack 518 by dry/wet etch process, followed by filling the opening with conductive materials and other materials for isolation purposes. TAC 514 can include conductive materials including, but not limited to, W, Co, Cu, Al, doped silicon, silicides, or any combination thereof. The opening of TAC 514 can be filled with conductive materials and other materials by ALD, CVD, PVD, electroplating, any other suitable processes, or any combination thereof.

In some embodiments, operation 904 further includes forming one or more through substrate via contacts each extending vertically through the chip substrate. The through substrate via contacts can be in contact with components in the alternating conductor/dielectric stack, such as the NAND memory strings. As illustrated in FIG. 5B, TSVs 522 are formed through silicon substrate 502 and in contact with NAND memory strings 512. In some embodiments, fabrication processes to form TSV 522 include forming a vertical opening through silicon substrate 502 by dry/wet etch process, followed by filling the opening with conductive materials and other materials for isolation purposes. TSV 522 can include conductive materials including, but not limited to, W, Co, Cu, Al, doped silicon, silicides, or any combination thereof. The opening of TSV 522 can be filled with conductive materials and other materials by ALD, CVD, PVD, electroplating, any other suitable processes, or any combination thereof.

Figure 5C:
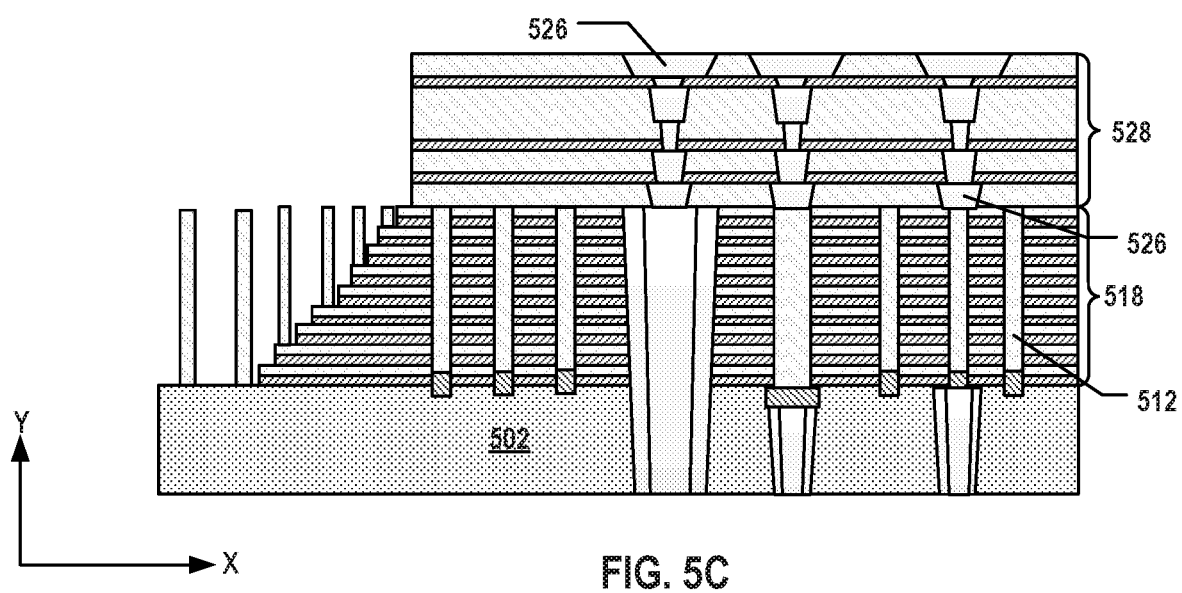

Method 900 proceeds to operation 906, as illustrated in FIG. 9, in which an interconnect layer (e.g., an array interconnect layer) is formed above the NAND memory strings. As illustrated in FIG. 5C, an array interconnect layer 528 is formed above alternating conductor/dielectric stack 518 and NAND memory strings 512 therein. Array interconnect layer 528 can include interconnects 526, including interconnect lines and via contacts, in one or more ILD layers for transferring electrical signals to and from NAND memory strings 512.

In some embodiments, array interconnect layer 528 includes multiple ILD layers and interconnects 526 therein formed in multiple processes. For example, interconnects 526 can include conductive materials deposited by one or more thin film deposition processes including, but not limited to, CVD, PVD, ALD, electroplating, electroless plating, or any combination thereof. Fabrication processes to form interconnects 526 can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects 526 illustrated in FIG. 5C can be collectively referred to as an "interconnect layer" (e.g., array interconnect layer 528).

Figure 5D:
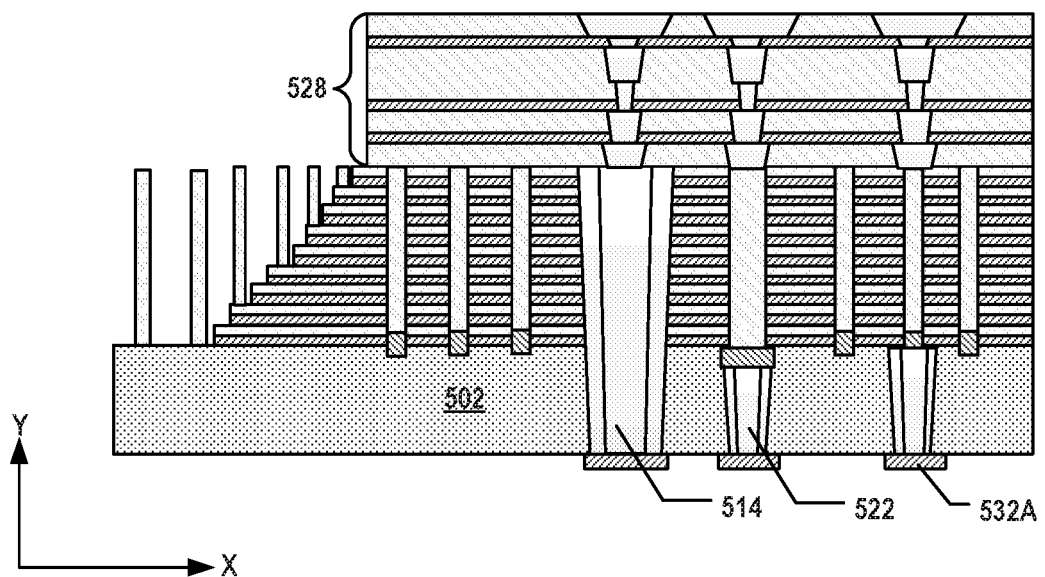
Figure 5E:
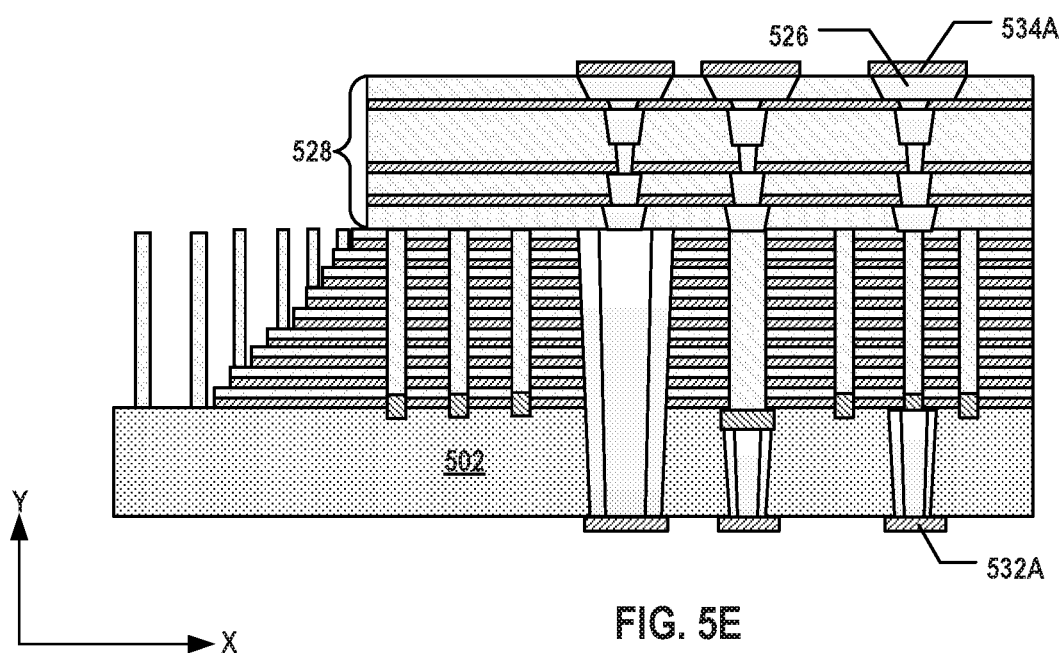

Method 900 proceeds to operation 908, as illustrated in FIG. 9, in which chip contacts are formed on one or both outer surfaces (e.g., the top and/or bottom surface) of the memory array device chip. A first set of chip contacts can be formed at the front side of the chip substrate, and a second set of chip contacts can be formed at the backside of the chip substrate. Each chip contact can be either a conductive pad (e.g., a solder pad) or a conductive bump (e.g., a solder bump). As shown in FIG. 5D, bottom conductive pads 532A can be formed on the bottom surface of the memory array device chip, e.g., at the backside of silicon substrate 502. In some embodiments, bottom conductive pads 532A are in contact with TAC 514 and TSVs 522, respectively. As illustrated in FIG. 5E, top conductive pads 534A can be formed on the top surface of the memory array device chip, e.g., at the front side of chip substrate 502 and on array interconnect layer 528. In some embodiments, top conductive pads 534A are in contact with interconnects 526 in array interconnect layer 528, respectively. In some embodiments, fabrication process to form conductive pads 532A and 534A include forming one or more conductor films, which can include conductive materials including, but not limited to Al, Au, Cu, Cr, Ni, TiW, or any combination thereof. The conductor films can be formed by PVD, CVD, ALD, electroplating, electroless plating, any other suitable processes, or any combination thereof.

Figure 5F:
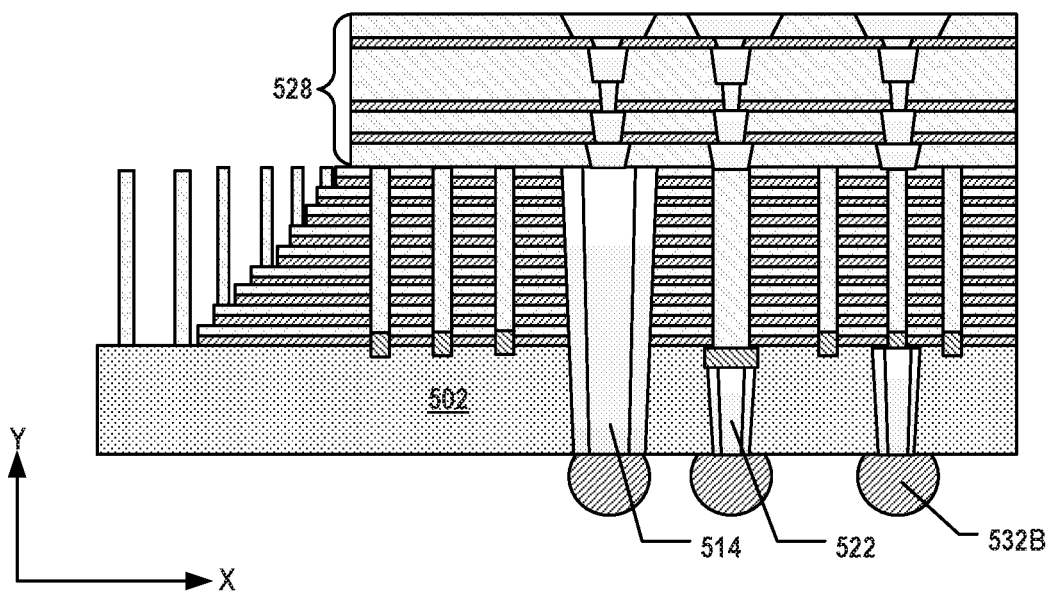
Figure 5G:
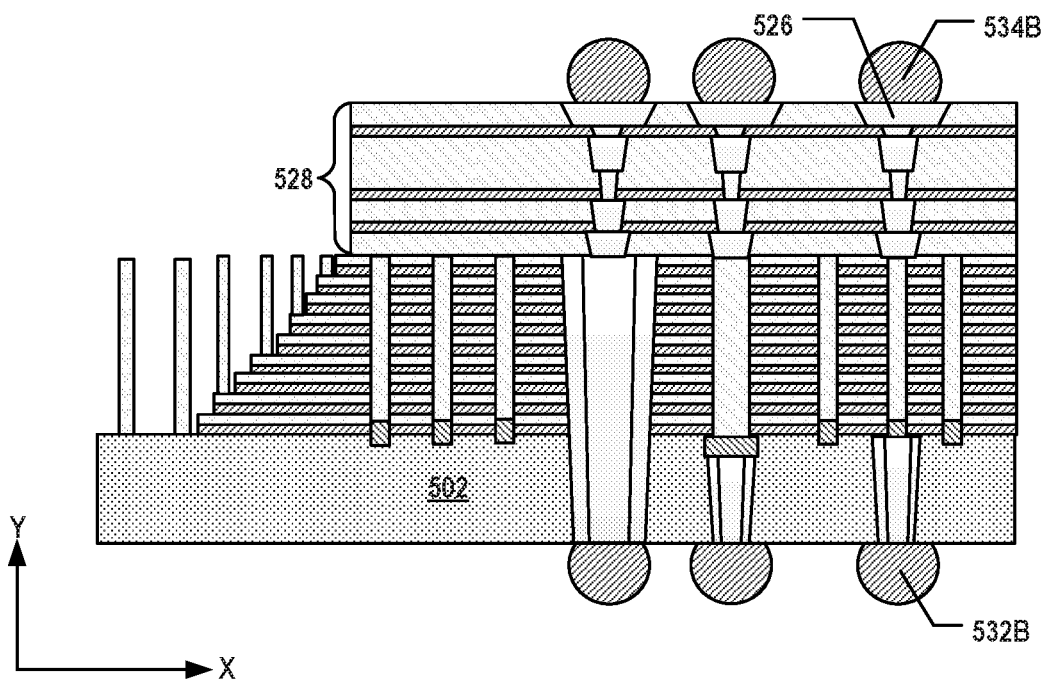

Alternatively, as shown in FIG. 5F, bottom conductive bumps 532B can be formed on the bottom surface of the memory array device chip, e.g., at the backside of silicon substrate 502. In some embodiments, bottom conductive bumps 532B are in contact with TAC 514 and TSVs 522, respectively. As illustrated in FIG. 5G, top conductive bumps 534B can be formed on the top surface of the memory array device chip, e.g., at the front side of chip substrate 502 and on array interconnect layer 528. In some embodiments, top conductive bumps 534B are in contact with interconnects 526 in array interconnect layer 528, respectively. In some embodiments, fabrication processes to form conductive bumps 532B and 534B include forming solder pads and then solder bumps. The solder bumps can include solder materials including, but not limited to 63Sn/Pb, Cu/Sb/Ag/Sn, and 95.5Sn/3.8Ag/0.7Cu. The solder bumps can be formed by PVD, CVD, electroplating, electroless plating, any other suitable processes, or any combination thereof. In some embodiments, thermal reflow is applied after deposition of the solder materials.

Figure 10:
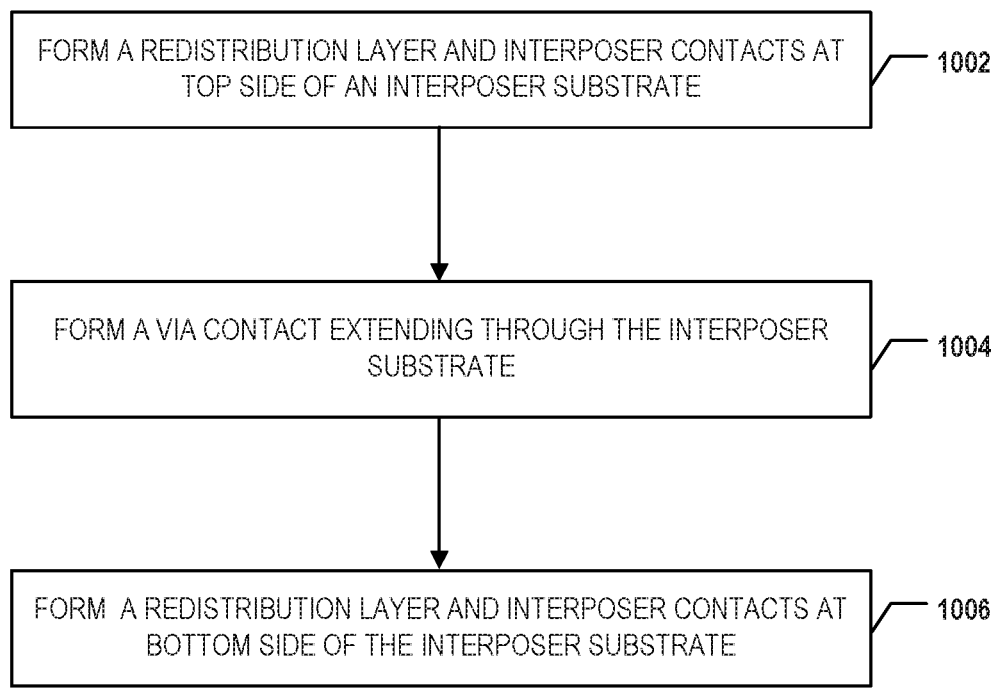
FIG. 10 is a flowchart of an exemplary method for forming an interposer, according to some embodiments.

FIGS. 6A-6F illustrate an exemplary fabrication process for forming an interposer, according to some embodiments of the present disclosure. FIG. 10 is a flowchart of an exemplary method 1000 for forming an interposer, according to some embodiments. Examples of the interposer depicted in FIGS. 6A-6F and FIG. 10 include first and second interposers 124 and 164 depicted in FIG. 1. FIGS. 6A-6F and FIG. 10 will be described together. It should be understood that the operations shown in method 1000 are not exhaustive and that other operations can be performed as well before, after, or between any of the illustrated operations. Further, some of the operations may be performed simultaneously, or in a different order than shown in FIG. 10.

Figure 6A:
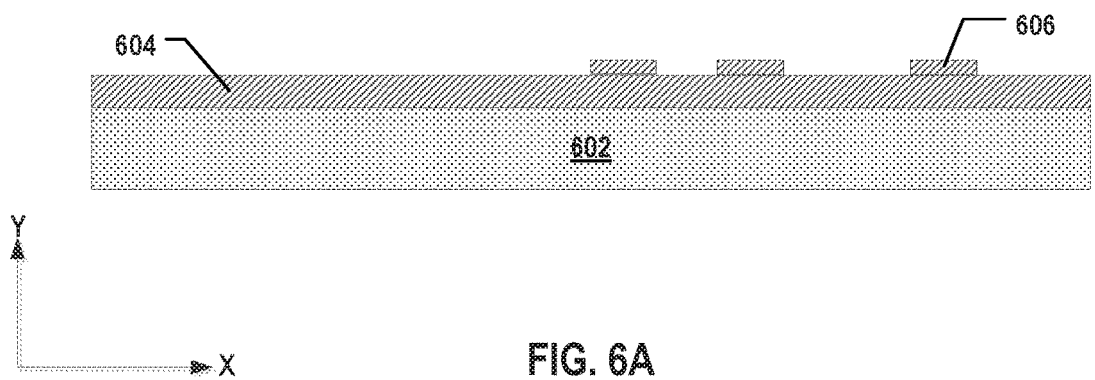
FIGS. 6A-6F illustrate an exemplary fabrication process for forming an interposer, according to some embodiments.

Referring to FIG. 10, method 1000 starts at operation 1002, in which a first redistribution layer and a first set of interposer contacts are formed at one side (e.g., the top side) of an interposer substrate. The first set of interposer contacts can be conductive pads or conductive bumps. As illustrated in FIG. 6A, an interposer substrate 602 can be made from materials including, but not limited to, silicon (e.g., single crystalline silicon), glass, and ceramic. A first redistribution layer 604 can be formed on the top surface of interposer substrate 602 and include interconnects, such as interconnect lines and via contacts formed in one or more ILD layers, such that electrical signals can transfer laterally without short circuiting to one another. The interconnects can include conductive materials including, but not limited to, W, Co, Cu, Al, silicides, or any combination thereof. The ILD layers can include dielectric materials deposited by one or more thin film deposition processes including, but not limited to, CVD, PVD, ALD, or any combination thereof. The ILD layers and interconnects can be collectively referred to as an "redistribution layer" (e.g., first redistribution layer 604).

A first set of conductive pads 606 can be formed on first redistribution layer 604 at the top side of interposer substrate 602. Conductive pads 606 can be in contact with the interconnects in first redistribution layer 604. In some embodiments, conductive pads 606 are solder pads, which include multiple conductor films made from conductive material including, but not limited to Al, Au, Cu, Cr, Ni, TiW, or any combination thereof. The conductor films can be formed by PVD, CVD, ALD, electroplating, electroless plating, any other suitable processes, or any combination thereof.

Figure 6B:
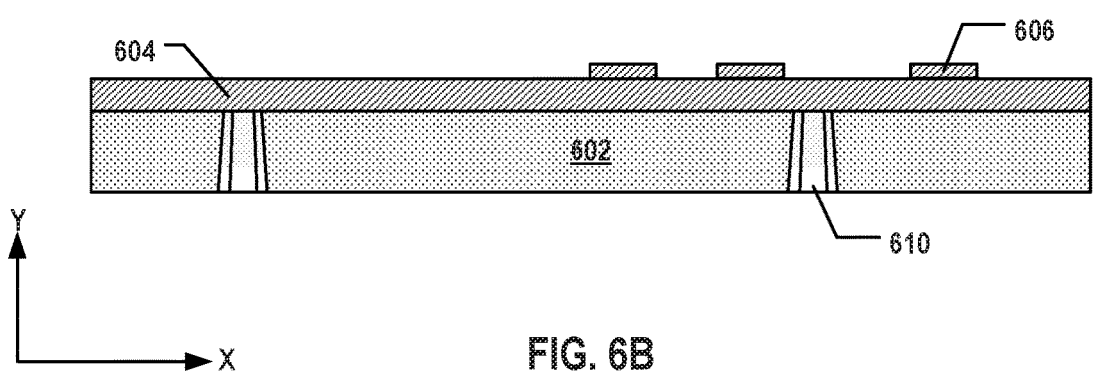

Method 1000 proceeds to operation 1004, in which via contacts each extending through the interposer substrate (e.g., TSVs if the interposer substrate is a silicon substrate) are formed. As illustrated in FIG. 6B, a plurality of via contacts 610 (referred to as "through substrate via contacts") are formed through the entire thickness of interposer substrate 602 and in contact with the interconnects in first redistribution layer 604. In some embodiments, through substrate via contacts 610 make direct electrical contact with conductive pads 606 if first redistribution layer 604 is not used. Through substrate via contacts 610 can include conductive materials including, but not limited to Al, Cu, and W.

In some embodiments, the processes to form through substrate via contacts 610 include photolithography, dry/wet etch, deposition, etc.

Figure 6C:
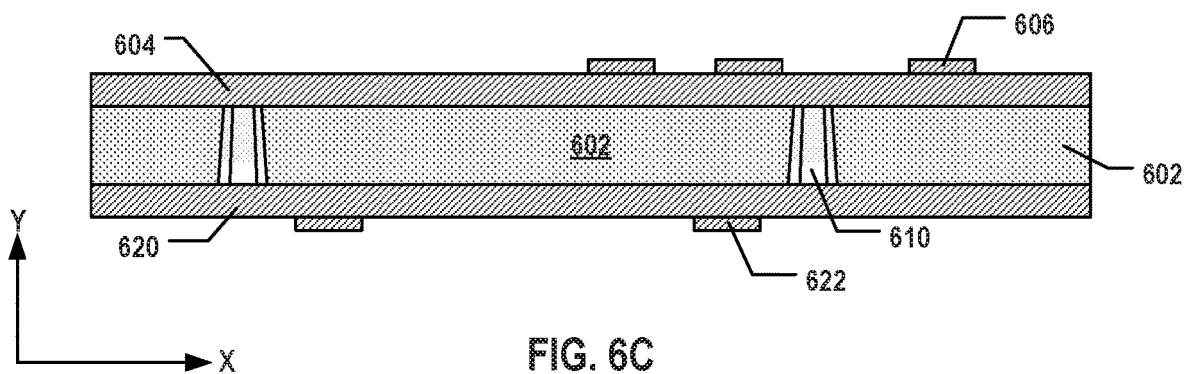

Method 1000 proceeds to operation 1006 in which, a second redistribution layer and a second set of interposer contacts are formed at another side (e.g., the bottom side) of the interposer substrate. The second set of interposer contacts can be conductive pads or conductive bumps. The second redistribution layer can be electrically connected to the first redistribution layer by the through substrate via contacts. As illustrated in FIG. 6C, a second redistribution layer 620 can be formed on the bottom surface of interposer substrate 602 and include interconnects, such as interconnect lines and via contacts, formed in one or more ILD layers, such that electrical signals can transfer laterally without short circuiting to one another. The interconnects in second redistribution layer 620 can be in contact with through substrate via contacts 610. The interconnects can include conductive materials including, but not limited to, W, Co, Cu, Al, silicides, or any combination thereof. The ILD layers can include dielectric materials deposited by one or more thin film deposition processes including, but not limited to, CVD, PVD, ALD, or any combination thereof. The ILD layers and interconnects can be collectively referred to as an "redistribution layer" (e.g., second redistribution layer 620).

A second set of conductive pads 622 can be formed on second redistribution layer 620 at the bottom side of interposer substrate 602. Conductive pads 622 can be in contact with the interconnects in second redistribution layer 620. First and second sets of conductive pads 606 and 622 on opposite sides of interposer substrate 602 thus can be electrically connected by first and second redistribution layers 604 and 620 and through substrate via contacts 610. In some embodiments, conductive pads 622 are solder pads, which include multiple conductor films made from conductive material including, but not limited to Al, Au, Cu, Cr, Ni, TiW, or any combination thereof. The conductor films can be formed by PVD, CVD, ALD, electroplating, electroless plating, any other suitable processes, or any combination thereof.

Figure 6D:
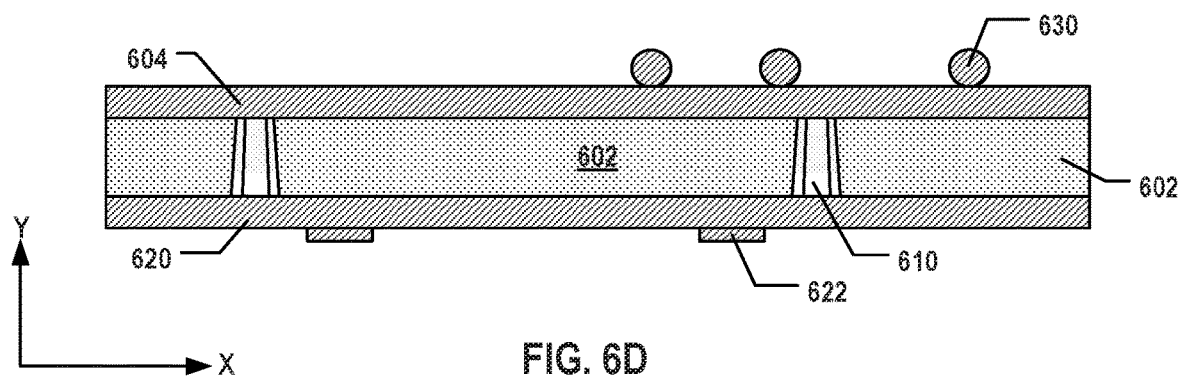
Figure 6E:
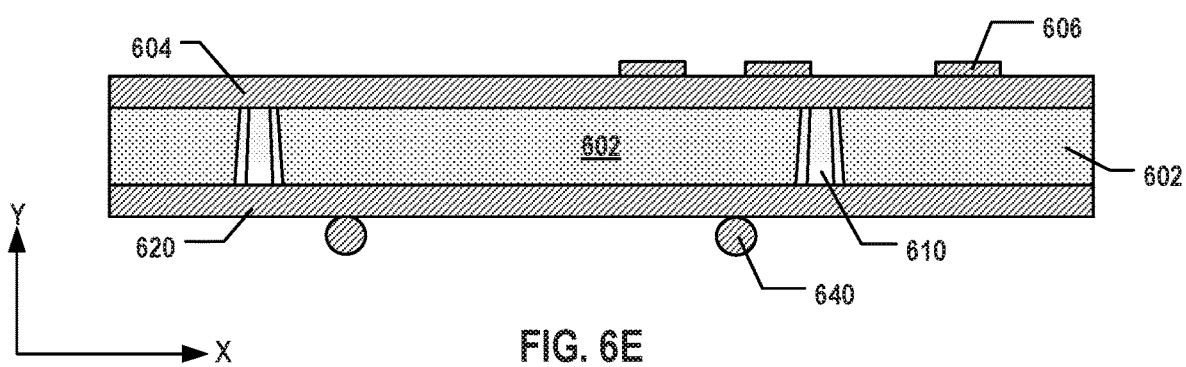
Figure 6F:
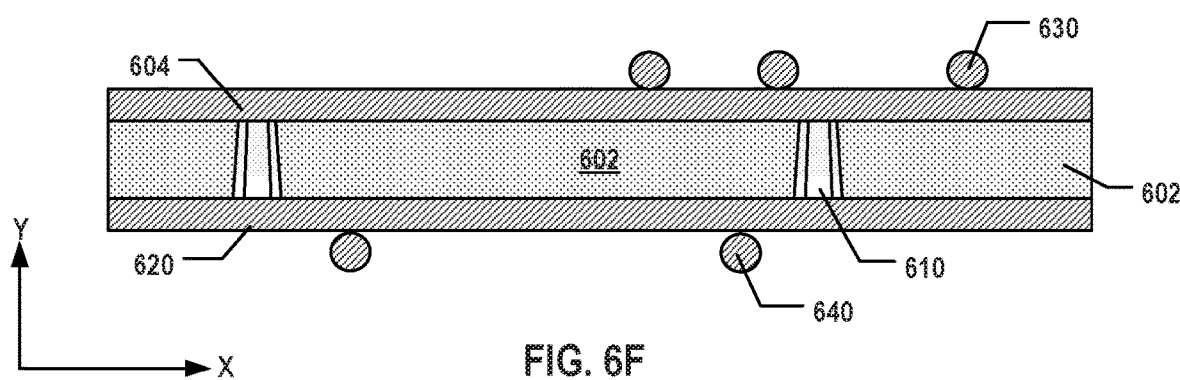

As described above, the interposer contacts on either side of the interposer can be conductive pads or conductive bumps. In some embodiments, each conductive pad 606 at the top side of interposer substrate 602 further includes a conductive bump (e.g., a solder bump), turning themselves into conductive bumps 630 as shown in FIG. 6D. In some embodiments, each conductive pad 622 at the bottom side of interposer substrate 602 further include a conductive bump (e.g., a solder bump), turning themselves into conductive bumps 640 as shown in FIG. 6E. In some embodiments, conductive pads 606 and 622 at both top and bottom sides of interposer substrate 602 each further includes a conductive bump (e.g., a solder bump), turning themselves into conductive bumps 630 and 640, respectively, as shown in FIG. 6F. The solder bumps can include solder materials including, but not limited to 63Sn/Pb, Cu/Sb/Ag/Sn, and 95.5Sn/3.8Ag/0.7Cu. The solder bumps can be formed by PVD, CVD, electroplating, electroless plating, any other suitable processes, or any combination thereof. In some embodiments, thermal reflow is applied after deposition of the solder materials.

Figure 7A:
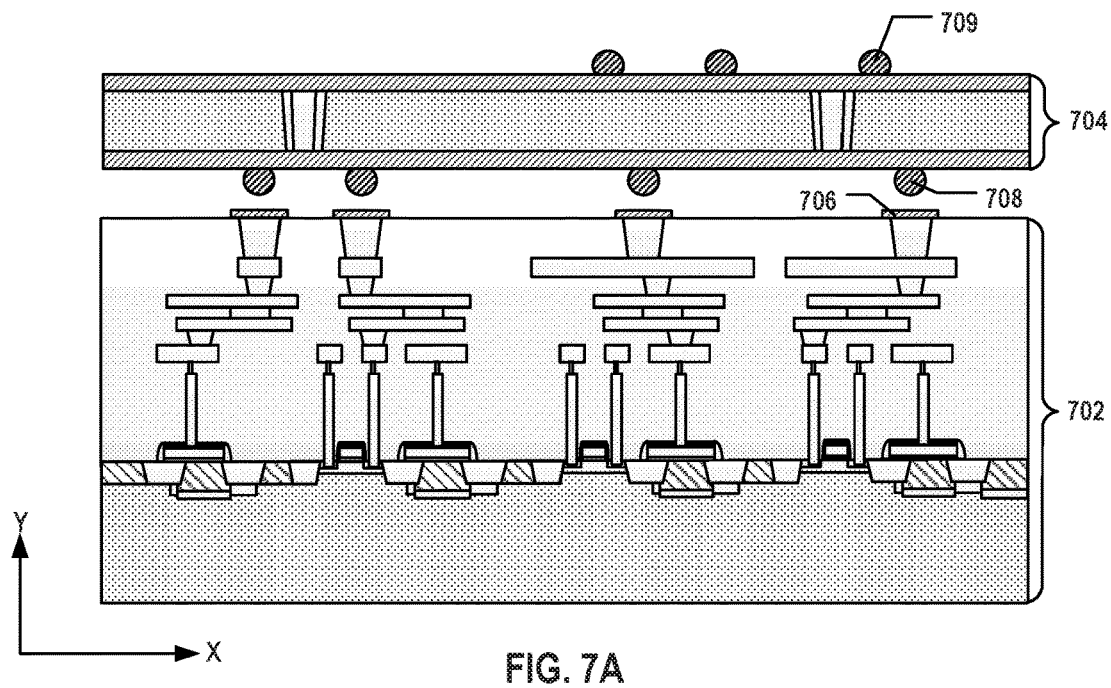
FIGS. 7A-7B illustrate an exemplary fabrication process for attaching a peripheral device chip and a memory device array device chip to an interposer, according to some embodiments.
Figure 7B:
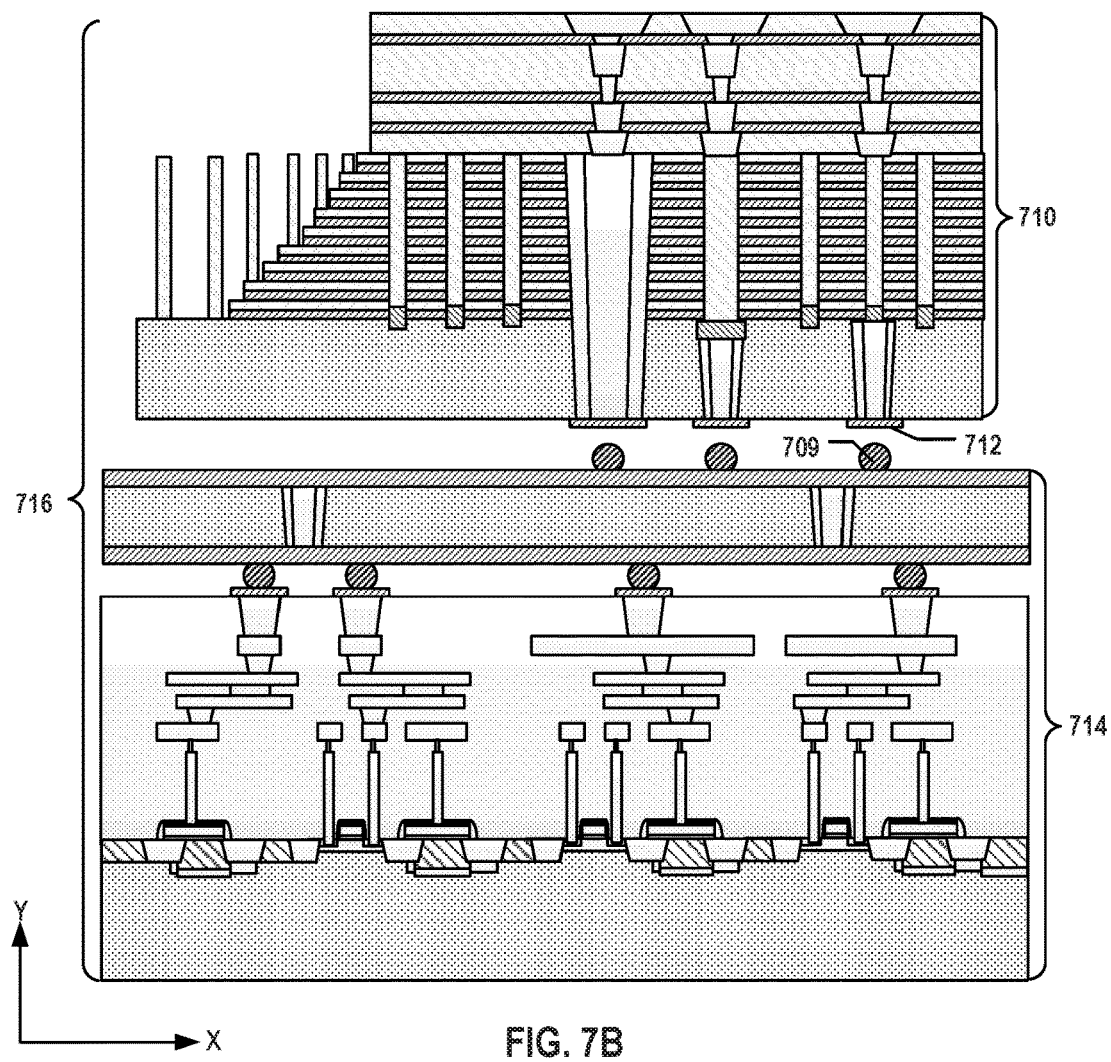

After forming the device chips (e.g., the peripheral device chip and memory array device chip) and the interposers, the device chips can be vertically joined using the interposers through a joining process. In some embodiments, the chip contacts on the outer surface (e.g., the top or bottom surface) of a first device chip are attached to the interposer contacts on one side of an interposer, and the chip contacts on the outer surface (e.g., the top or bottom surface) of a second device chip are attached to the interposer contacts on another side of the interposer. As a result, the first and second device chips are electrically and mechanically coupled in the vertical direction using the interposer. FIGS. 7A-7B illustrate an exemplary fabrication process for attaching a peripheral device chip and a memory device array device chip to an interposer, according to some embodiments.

As shown in FIG. 7A, an interposer 704 is positioned slightly above a peripheral device chip 702, such that each of interposer contacts 708 on the bottom surface of interposer 704 is aligned to a corresponding chip contact 706 on the top surface of peripheral device chip 702. Interposer 704 is then lowered untill most of interposer contacts 708 are in physical contact with chip contacts 706. In some embodiments, a thermal process, such as thermal compression, is applied to join interposer 704 to peripheral device chip 702, through the solder bonding formed between interposer contacts 708 and chip contacts 706. The first joining process forms a composite device 714 as shown in FIG. 7B. The same joining process can be repeated to attach bottom chip contacts 712 of a memory array device chip 710 to interposer contacts 709 on the top surface of interposer 704. Consequently, memory array device chip 710 is joined to composite device 714 through the solder bonding formed between interposer contacts 709 and bottom chip contacts 712. A two-level memory device 716 is formed after the two joining processes are performed. In some embodiments, if one of the mating contacts (e.g., an interposer contact or a chip contact) includes a conductive pad (e.g., a solder pad), then the other mating contact includes a conductive bump (e.g., a solder bump) to facilitate the joining process.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming an alternating conductor/dielectric stack at a first side of a chip substrate;
    forming a memory string extending vertically through the alternating conductor/dielectric stack;
    forming a chip contact on the alternating conductor/dielectric stack, the chip contact electrically connected to the memory string, wherein the alternating conductor/dielectric stack is disposed between the chip contact and the chip substrate;
    forming a first interposer contact at a first side of an interposer substrate;
    forming a second interposer contact at a second side opposite to the first side of the interposer substrate, the second interposer contact electrically connected to the first interposer contact through the interposer substrate; and
    attaching the first interposer contact to the chip contact.

2. The method of claim 1, further comprising:
    prior to forming the first interposer contact, forming a redistribution layer on the interposer substrate; and
    forming a first via contact extending through the interposer substrate and in contact with the redistribution layer, such that the first and second interposer contacts are electrically connected through the redistribution layer and the first via contact.

3. The method of claim 1, further comprising:
    forming a second via contact extending vertically through the alternating conductor/dielectric stack; and
    forming an interconnect layer at the first side of the chip substrate and in contact with the second via contact.

4. A method for forming a three-dimensional (3D) memory device, comprising:
    forming an alternating conductor/dielectric stack at a first side of a chip substrate;
    forming a memory string extending vertically through the alternating conductor/dielectric stack;
    forming a chip contact at the first side of the chip substrate, the chip contact electrically connected to the memory string;
    forming a first interposer contact at a first side of an interposer substrate;
    forming a second interposer contact at a second side opposite to the first side of the interposer substrate, the second interposer contact electrically connected to the first interposer contact through the interposer substrate; and
    attaching the first interposer contact to the chip contact,
    wherein the alternating conductor/dielectric stack is formed between the interposer substrate and the chip substrate.

5. The method of claim 4, further comprising:
    prior to forming the first interposer contact, forming a redistribution layer on the interposer substrate; and
    forming a first via contact extending through the interposer substrate and in contact with the redistribution layer, such that the first and second interposer contacts are electrically connected through the redistribution layer and the first via contact.

6. The method of claim 4, further comprising:
    forming a second via contact extending vertically through the alternating conductor/dielectric stack; and
    forming an interconnect layer at the first side of the chip substrate and in contact with the second via contact and the chip contact.

7. The method of claim 1, wherein forming the chip contact at the first side of the chip substrate on the alternating conductor/dielectric stack, comprises:
    forming at least one conductive pad at the first side of the chip substrate on the alternating conductor/dielectric stack.

8. The method of claim 7, wherein a dimension of a conductive pad is between about 100 nm and about 1 µm.

9. The method of claim 1, wherein forming the chip contact at the first side of the chip substrate on the alternating conductor/dielectric stack, comprises:
    forming at least one conductive bump at the first side of the chip substrate on the alternating conductor/dielectric stack.

10. The method of claim 9, wherein a dimension of a conductive bump is between about 1 µm and about 100 µm.

11. The method of claim 4, wherein forming the chip contact at the first side of the chip substrate, comprises:
    forming at least one conductive pad at the first side of the chip substrate on the alternating conductor/dielectric stack.

12. The method of claim 11, wherein a dimension of a conductive pad is between about 100 nm and about 1 µm.

13. The method of claim 4, wherein forming the chip contact at the first side of the chip substrate, comprises:
    forming at least one conductive bump at the first side of the chip substrate on the alternating conductor/dielectric stack.

14. The method of claim 13, wherein a dimension of a conductive bump is between about 1 µm and about 100 µm.

15. A method for forming a three-dimensional (3D) memory device, comprising:
    forming a first device chip having a peripheral device and a first chip contact disposed on a surface of the first device chip and electrically connected to the peripheral device;
    forming a second device chip, comprising:
        forming an alternating conductor/dielectric stack at a first side of a chip substrate;
        forming a memory string extending vertically through the alternating conductor/dielectric stack; and
        forming a second chip contact at the first side of the chip substrate, the second chip contact electrically connected to the memory string;
    forming an interposer, comprising:
        forming a first interposer contact at a first side of an interposer substrate; and
        forming a second interposer contact at a second side opposite to the first side of the interposer substrate, the second interposer contact electrically connected to the first interposer contact through the interposer substrate;
    attaching the first interposer contact to the first chip contact; and
    attaching the second interposer contact to the second chip contact.

16. The method of claim 15, further comprising:
    prior to forming the first interposer contact, forming a redistribution layer on the interposer substrate; and
    forming a first via contact extending through the interposer substrate and in contact with the redistribution layer, such that the first and second interposer contacts are electrically connected through the redistribution layer and the first via contact.

17. The method of claim 15, further comprising:
    forming a second via contact extending vertically through the alternating conductor/dielectric stack; and forming an interconnect layer at the first side of the chip substrate and in contact with the second via contact and the second chip contact.

18. The method of claim 15, wherein forming the second chip contact at the first side of the chip substrate, comprises:
forming at least one conductive pad at the first side of the chip substrate on the alternating conductor/dielectric stack.

19. The method of claim 15, wherein forming the second chip contact at the first side of the chip substrate, comprises:
forming at least one conductive bump at the first side of the chip substrate on the alternating conductor/dielectric stack.

20. The method of claim 15, wherein the second chip contact and the memory string are disposed on a same side of the chip substrate on which the alternating conductor/dielectric stack is formed.

* * * * *